US012519015B2

(12) United States Patent
Chan et al.

(10) Patent No.: US 12,519,015 B2
(45) Date of Patent: Jan. 6, 2026

(54) CONDUCTIVE VIA FORMATION CONNECTING TRANSISTOR STRUCTURES IN AN INTEGRATED CIRCUIT

(71) Applicant: IMEC VZW, Leuven (BE)

(72) Inventors: Boon Teik Chan, Wilsele (BE); Dunja Radisic, Heverlee (BE); Bilal Chehab, Leuven (BE)

(73) Assignee: IMEC VZW, Leuven (BE)

( * ) Notice: Subject to any disclaimer, the term of this patent is extended or adjusted under 35 U.S.C. 154(b) by 412 days.

(21) Appl. No.: 18/054,228

(22) Filed: Nov. 10, 2022

(65) Prior Publication Data

US 2023/0197528 A1 Jun. 22, 2023

(30) Foreign Application Priority Data

Dec. 21, 2021 (EP) ..................................... 21216251

(51) Int. Cl.
*H01L 21/768* (2006.01)
*H01L 23/522* (2006.01)
*H10D 84/01* (2025.01)
*H10D 84/03* (2025.01)
*H10D 84/85* (2025.01)

(52) U.S. Cl.
CPC .. *H01L 21/76877* (2013.01); *H01L 21/76879* (2013.01); *H01L 23/5226* (2013.01); *H10D 84/0186* (2025.01); *H10D 84/038* (2025.01); *H10D 84/85* (2025.01)

(58) Field of Classification Search
CPC ......... H01L 21/76834; H01L 21/76877; H01L 21/76879; H01L 21/76883; H01L 21/76885; H01L 21/76895; H01L 21/76897; H01L 23/5226; H10D 84/01; H10D 84/0186; H10D 84/038; H10D 84/8311; H10D 84/8312; H10D 84/83135; H10D 84/83138; H10D 84/8314; H10D 84/8316; H10D 84/85; H10D 84/851–852

See application file for complete search history.

(56) References Cited

U.S. PATENT DOCUMENTS

2013/0248990 A1    9/2013    Kim et al.
2016/0005822 A1    1/2016    Song et al.
2019/0181042 A1    6/2019    Xie et al.

OTHER PUBLICATIONS

Extended European Search Report and Written Opinion, Application No. EP 21216251.5, mailed Jun. 13, 2022, 5 pages.

*Primary Examiner* — Cheung Lee
(74) *Attorney, Agent, or Firm* — McDonnell Boehnen Hulbert & Berghoff LLP

(57) ABSTRACT

A method for forming an integrated circuit. The method includes providing a semiconductor structure comprising: (i) two transistors, (ii) a gate on the channel of the transistor, (iii) contacts coupled to each transistor, (iv) a dielectric layer over the two transistors, the gate, and the contacts, (v) a first conductive line arranged within a first metallization level and extending along a first direction, (vi) a first conductive via connecting the first conductive line with a first contact of a transistor, and (vii) a second conductive via connecting the first conductive line with a second contact of a transistor. The method also includes recessing the first dielectric layer, providing spacers along the first conductive line, depositing a second dielectric layer on the first dielectric layer, forming an opening in the second dielectric layer and first dielectric layer, and providing a conductive material in the opening, thereby forming a third conductive via.

20 Claims, 21 Drawing Sheets

CONDUCTIVE VIA FORMATION CONNECTING TRANSISTOR STRUCTURES IN AN INTEGRATED CIRCUIT

CROSS-REFERENCE TO RELATED APPLICATION

The present application is a non-provisional patent application claiming priority to European Patent Application No. 21216251.5, filed Dec. 21, 2021, the contents of which are hereby incorporated by reference.

FIELD OF THE DISCLOSURE

The present disclosure relates to the field of integrated circuits, and more in particular to a metallization scheme for forming an integrated circuit.

BACKGROUND

There is a constant drive to scale down integrated circuits. This translates into a need for reducing the size of the standard cell used in integrated circuits. In this respect, the type of transistor used and the way metal track lines are packed are key factors. In particular, the poly pitch (i.e., the pitch of successive transistor gates), the metal pitch (i.e., the pitch of successive metal track lines), and the cell height can, in principle, be minimized.

However, scaling poly pitch further becomes very challenging. This has motivated recent attempts at reducing cell height. These attempts have reduced the height of the standard cell which has become more rectangular as a result. This is illustrated in FIG. 21. As can be readily observed, reducing the cell height also reduces the number of metal track lines per standard cell. This has an impact on how one can connect one circuit to another circuit on the wafer. Indeed, reducing the number of metal track lines per standard cell also reduces the routability of the lower metal layers of the standard cell due to high pin density, low pin accessibility, and limited routing resources.

For these reasons, the cell height remains stuck at the "five-track" level, i.e., a cell height that can vertically accommodate five tracks to access the pins.

There is therefore a need in the art for new methods and systems to scale down integrated circuits.

SUMMARY

The present disclosure describes example embodiments directed to systems and/or methods for forming an integrated circuit.

In a first aspect, the present disclosure relates to a method for forming an integrated circuit or an intermediate (15) in a formation thereof. The method comprises providing a semiconductor structure (16) comprising two transistor structures (3a, 3b) separated by a dielectric separation (7). Each transistor structure (3a, 3b) comprises a pMOS side (5p) of a first doping type and an nMOS side (5n) of a second doping type. Each side forms a channel structure, a source portion, and a drain portion. The source portion and the drain portion being horizontally separated by the channel structure. The semiconductor structure also comprises a gate structure on the channel structure. The gate structure comprises a gate electrode (1) and a gate plug (4). The semiconductor structure further comprises electrically conductive contacts (M0A) electrically coupled to the source portion and the drain portion of each side (5p, 5n) of each transistor structure (3a, 3b). Moreover, the semiconductor structure comprises a first dielectric layer (8) over the two transistor structures (3a, 3b), the gate structure, and the electrically conductive contacts (M0A). Additionally, the semiconductor structure comprises a first electrically conductive line (M0B) embedded in the first dielectric layer (8) so that a top surface (19) of the first electrically conductive line (M0B) and a top surface (20) of the first dielectric layer (8) are coplanar. The first electrically conductive line (M0B) being arranged within a first metallization level and extending along a first direction. The first electrically conductive line (M0B) extends above at least part of each transistor structure (3a, 3b). Furthermore, the semiconductor structure comprises a first electrically conductive via (V0A1) electrically connecting the first electrically conductive line (M0B) with a first electrically conductive contact (M0A1) on a first side (5n, 5p) of a first transistor structure (3a) of the transistor structures (3a, 3b). Furthermore still, the semiconductor structure comprises a second electrically conductive via (V0A2) electrically connecting the first electrically conductive line (M0B) with a second electrically conductive contact (M0A2) on a first side (5n, 5p) of a second transistor structure (3b) of the transistor structures (3a, 3b).

The method of the first aspect also includes recessing the first dielectric layer (8) so as to expose a top portion (2) of all sidewalls of the first electrically conductive line (M0B). Moreover, the method of the first aspect includes providing spacers (13) along each sidewall of the first electrically conductive line (M0B). Additionally, the method of the first aspect includes depositing a second dielectric layer (10) on the first dielectric layer (8) so that a top surface of the spacers (13), a top surface of the first electrically conductive line (M0B), and a top surface of the second dielectric layer (10) are coplanar. Furthermore, the method of the first aspect includes etching through the second dielectric layer (10), the first dielectric layer (8), and the gate plug (4) by using at least one of the spacers (13) as a mask, thereby forming an opening (28) exposing a top surface of the gate electrode (1). Furthermore still, the method of the first aspect includes providing an electrically conductive material (14) in the opening (28), thereby forming a third electrically conductive via (VintG).

In at least some embodiments related to the first aspect, the method includes providing a protection (11) selectively on the top surface of the first electrically conductive line (M0B).

In a second aspect, the present disclosure relates to an integrated circuit or an intermediate in the fabrication thereof (15) obtainable by any embodiment of the first aspect.

In at least some of the example embodiments of the second aspect, the present disclosure relates to an integrated circuit or an intermediate (15) in a fabrication of an integrated circuit comprising a semiconductor structure. The semiconductor structure comprises two transistor structures (3a, 3b) separated by a dielectric separation (7). Each transistor structure (3a, 3b) comprises a pMOS side (5p) of a first doping type and an nMOS side (5n) of a second doping type. Each side forms a channel structure, a source portion, and a drain portion. The source portion and the drain portion being horizontally separated by the channel structure. The semiconductor structure comprises a gate structure on the channel structure. The gate structure comprises a gate electrode (1). The semiconductor structure further comprises electrically conductive contacts (M0A) electrically coupled to the source portion and the drain portion of each side (5p, 5n) of each transistor structure (3a, 3b). The semiconductor structure also comprises a first dielectric layer (8) over the two transistor structures (3a, 3b), the gate structure, and the electrically conductive contacts (M0A). Additionally, the semiconductor structure comprises a first electrically conductive line (M0B) embedded in the first dielectric layer (8), the first electrically conductive line (M0B) being arranged within a first metallization level and extending along a first direction. Moreover, the semiconductor structure comprises a first electrically conductive via (V0A1) electrically connecting the first electrically conductive line (M0B) with a first electrically conductive contact (M0A1) on a first side (5n, 5p) of a first transistor structure (3a) of the transistor structures (3a, 3b). Further, the semiconductor structure comprises a second electrically conductive via (V0A2) electrically connecting the first electrically conductive line (M0B) with a second electrically conductive contact (M0A2) on a first side (5n, 5p) of a second transistor structure (3b) of the transistor structures (3a, 3b). Furthermore, the semiconductor structure comprises spacers (13) along sidewalls of the first electrically conductive line (M0B). Furthermore still, the semiconductor structure comprises a third electrically conductive via through the first dielectric layer (8) and touching a spacer (13) and the gate electrode (1).

In at least some of the example embodiments, the presence of the spacer (13) provides a sufficient distance between M0B and VintG.

In at least some of the example embodiments, by forming the third electrically conductive via (VintG) right after the formation of the first electrically conductive line (M0B) and before the eventual formation of second electrically conductive lines (Mintl), the aspect ratio of the third electrically conductive via (VintG) is not as high as if it was formed after the eventual formation of second electrically conductive lines (Mintl), which is easier to achieve with quality and reliability. In at least some embodiments in which the third electrically conductive via (VintG) is formed, a deep via (e.g., VintG plus V5) linking the second electrically conductive lines (Mintl) to the gate electrode is formed in two steps. Each step forms a part (VintG or V5) of the deep via having a reasonable aspect ratio.

At least some of the example embodiments provide for the production of a scaled-down integrated circuit. For example, such example embodiments make it possible to construct a standard cell having a "four tracks" height where current technology only allows the production of a "five tracks" high standard cell.

At least some of the example embodiments provide for production of a standard cell having a height corresponding to "four tracks," wherein the metal track lines are no longer present along the standard cell vertical axis, but rather along its horizontal axis. This allows standard cells obtainable by embodiments of the present disclosure to be "four tracks" high while actually comprising more than four tracks. FIG. 21 shows two examples of standard cells having each metal track extending horizontally along the vertical axis of the cell. In a standard cell, the horizontal and vertical axes are defined with respect to the cell observed from above the substrate and oriented so that the transistor channel is oriented horizontally. Such cells can be referred to as HVH cells, because the first level of conductive lines has its lines extending horizontally (H), and since each successive level alternates in orientation. In at least some of the example embodiments, the first level of conductive lines has its lines extending vertically (V). Such cells can, therefore, be referred to as VHV cells.

Various aspects of the disclosure are set out in the accompanying independent and dependent claims. Features from the dependent claims can be combined with features of the independent claims and with features of other dependent claims as appropriate and not merely as explicitly set out in the claims.

Although there has been constant improvement, change, and evolution of devices in this field, this disclosure describes concepts that represent substantial new and novel improvements, including departures from prior practices. At least some of the described concepts can result in the provision of more efficient, stable and reliable devices of this nature.

The above and other characteristics, features, and advantages of the present disclosure will become apparent from the following detailed description, taken in conjunction with the accompanying drawings, which illustrate, by way of example, the principles of the disclosure. This description is given for the sake of example, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
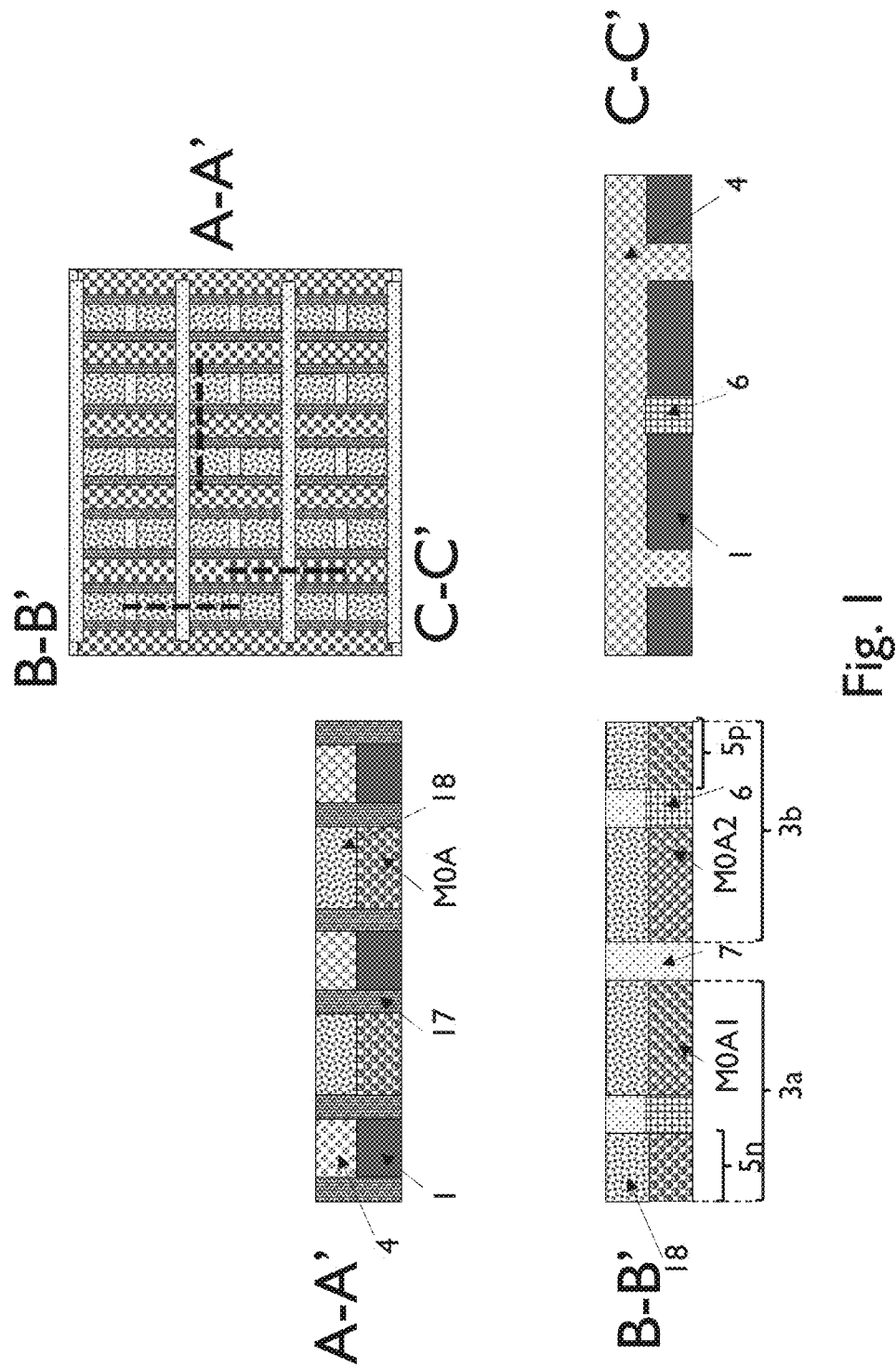
FIG. 1, FIG. 2, FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, and FIG. 20 is a schematic representation of a vertical cross-section through intermediates in the fabrication of an integrated circuit according to an embodiment of the present disclosure.
Figure 2:
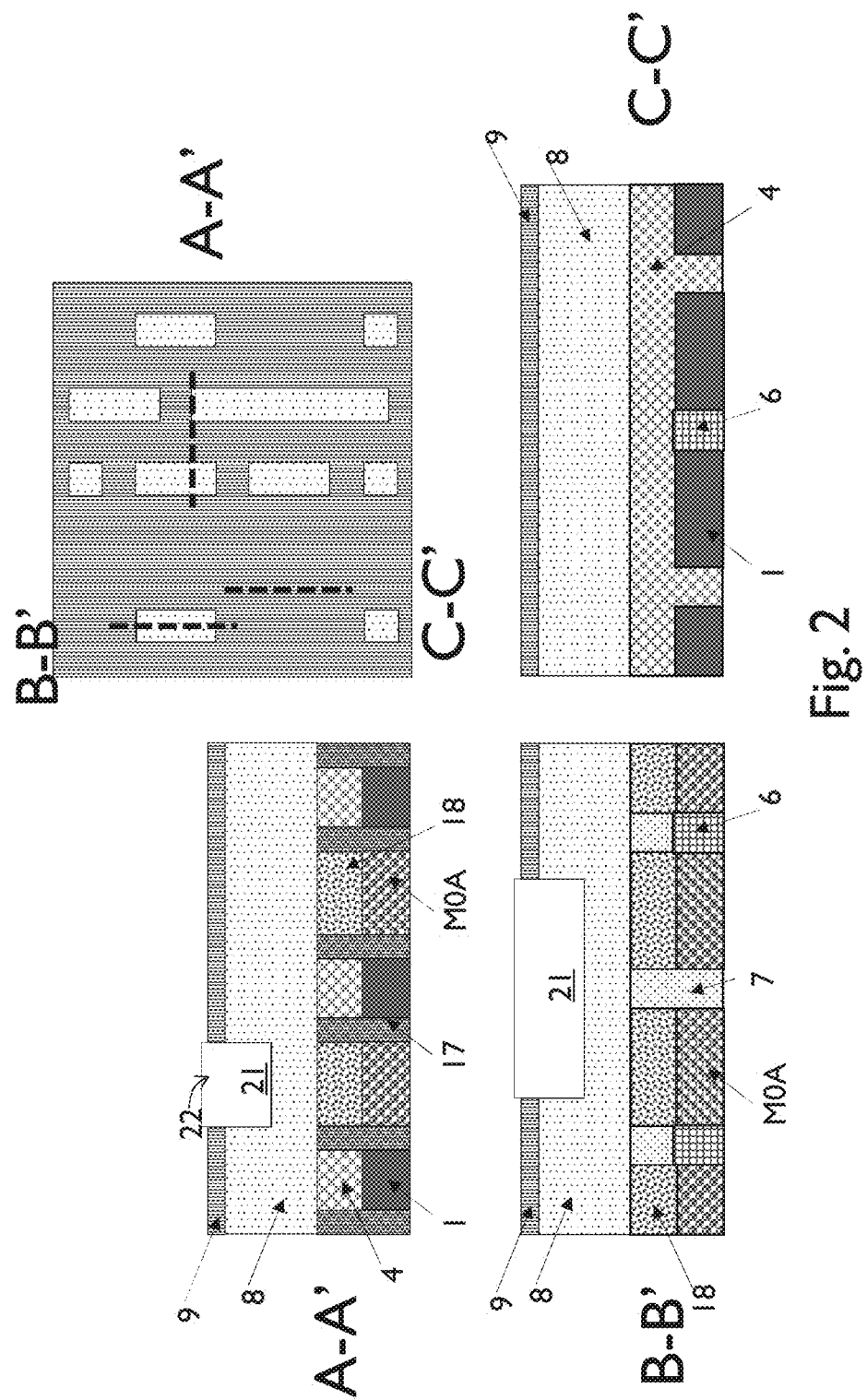
Figure 3:
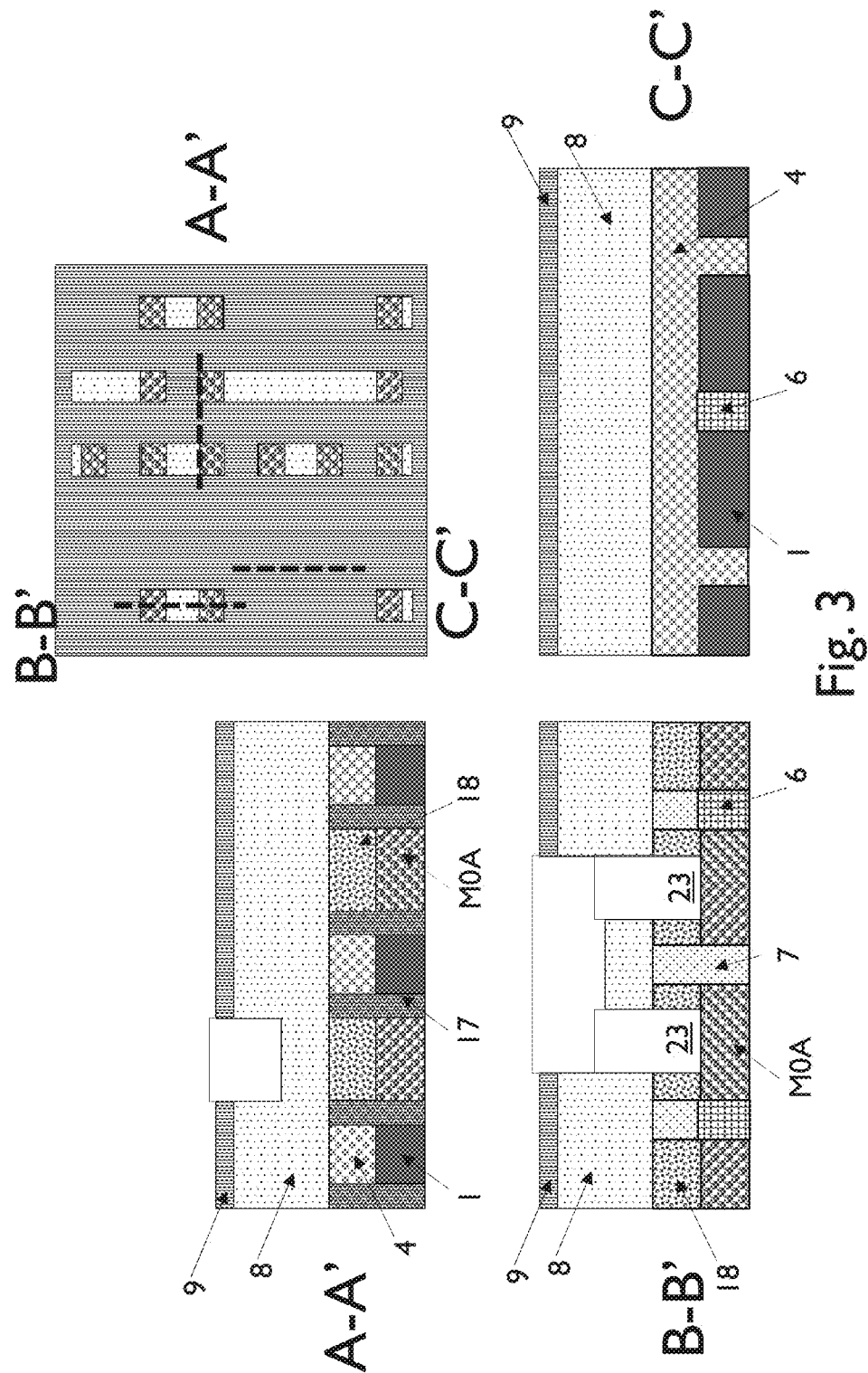

In the different figures, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

At least some of the example embodiments are discussed with reference to certain drawings. The drawings described are schematic and are non-limiting. In the drawings, the size of some of the elements may be exaggerated and not drawn on scale for illustrative purposes. Any dimensions and the relative dimensions are provided as examples.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the example embodiments that are capable of operation in a sequence, are further operable in a sequence other than a sequence described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the example embodiments described herein are capable of operation in other orientations than described or illustrated herein.

The term "comprising" within this disclosure should not be interpreted as being restricted to the means listed thereafter, and it does not exclude other elements or steps. In other words, "comprising" can be interpreted as specifying the presence of the stated features, integers, steps or components as referred to, but does not preclude the presence or addition of one or more other features, integers, steps or components, or groups thereof. The term "comprising" can therefore cover situations and/or arrangements where only the stated features are present (and can therefore always be replaced by "consisting of" in order to restrict the scope to the stated features) and/or the situations and/or arrangements where the stated features and one or more other features are present. Thus, the scope of the expression "a device comprising means A and B" should not be interpreted as being limited to devices consisting only of components A and B.

The term "coupled" within this disclosure should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

A reference within this disclosure to "one embodiment" or "an embodiment" means that a particular feature, structure or characteristic described in connection with the embodiment is included in at least one example embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

In at least some of the example embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the disclosure requires more features than are expressly recited in each claim. Rather, at least some of the claims can include less than all features of a single disclosed embodiment. Thus, the claims following the detailed description are hereby expressly incorporated into this detailed description by reference, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those having ordinary skill in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor programmed and/or including instructions for carrying out such a method or element of a method can form a means for carrying out the method or element of a method. Furthermore, an element described herein of an apparatus embodiment is an example of a means for carrying out the function performed by the element for the purpose of carrying out an example embodiment.

In this disclosure, numerous specific details are set forth. The example embodiments, however, may be practiced without these specific details. In other instances, well-known methods, structures and techniques have not been shown in detail in order not to obscure an understanding of this disclosure.

The following portion of the disclosure describes several example embodiments. It is clear that other example embodiments can be configured according to the knowledge of persons having ordinary skill in the art without departing from the technical teaching of this disclosure. Reference is now made to FIG. 4 to FIG. 20.

In a first aspect, an example embodiment relates to a method for forming an integrated circuit or an intermediate (15) in a formation thereof. The method comprises providing a semiconductor structure (16, FIG. 4). The semiconductor structure comprises two transistor structures (3a, 3b) separated by a dielectric separation (7). Each transistor structure (3a, 3b) comprises a pMOS side (5p) of a first doping type and an nMOS side (5n) of a second doping type. Each side forms a channel structure, a source portion, and a drain portion. The source portion and the drain portion are horizontally separated by the channel structure. The semiconductor structure also comprises a gate structure on the channel structure. The gate structure comprises a gate electrode (1) and a gate plug (4). The semiconductor structure further comprises electrically conductive contacts (M0A) electrically coupled to the source portion and the drain portion of each side (5p, 5n) of each transistor structure (3a, 3b). The semiconductor structure also comprises a first dielectric layer (8) over the two transistor structures (3a, 3b), the gate structure, and the electrically conductive contacts (M0A). Additionally, the semiconductor structure comprises a first electrically conductive line (M0B) embedded in the first dielectric layer (8) so that a top surface (19) of the first electrically conductive line (M0B) and a top surface (20) of the first dielectric layer (8) are coplanar. The first electrically conductive line (M0B) is arranged within a first metallization level and extending along a first direction. The first electrically conductive line (M0B) extends above at least part of each transistor structure (3a, 3b). Furthermore, the semiconductor structure comprises a first electrically conductive via (V0A1) electrically connecting the first electrically conductive line (M0B) with a first electrically conductive contact (M0A1) on a first side (5n, 5p) of a first transistor structure (3a) of the transistor structures (3a, 3b). Furthermore still, the semiconductor structure comprises a second electrically conductive via (V0A2) electrically connecting the first electrically conductive line (M0B) with a second electrically conductive contact (M0A2) on a first side (5n, 5p) of a second transistor structure (3b) of the transistor structures (3a, 3b).

In at least some embodiments, the method includes providing a protection (11, FIG. 5 to FIG. 7) selectively on a top surface of the first electrically conductive line (M0B).

Additionally, the method also includes recessing the first dielectric layer (8) so as to expose a top portion (2, FIG. 8) of all sidewalls of the first electrically conductive line (M0B). The method further includes providing spacers (13, FIG. 9) along each sidewall of the first electrically conductive line (M0B). The method also includes depositing a second dielectric layer (10, FIG. 10) on the first dielectric layer (8) so that a top surface of the spacers (13), a top surface of the protection (11) if present, a top surface of the first electrically conductive line (M0B) if no protection (11) is present, and a top surface of the second dielectric layer (10) are coplanar. Furthermore, the method includes etching through the second dielectric layer (10), the first dielectric layer (8), and the gate plug (4) by using at least one of the spacers (13) as a mask, thereby forming an opening (28, FIG. 11) exposing a top surface of the gate electrode (1). Furthermore still, the method includes providing an electrically conductive material in the opening (28), thereby forming a third electrically conductive via (VintG, FIG. 12).

Figure 4:
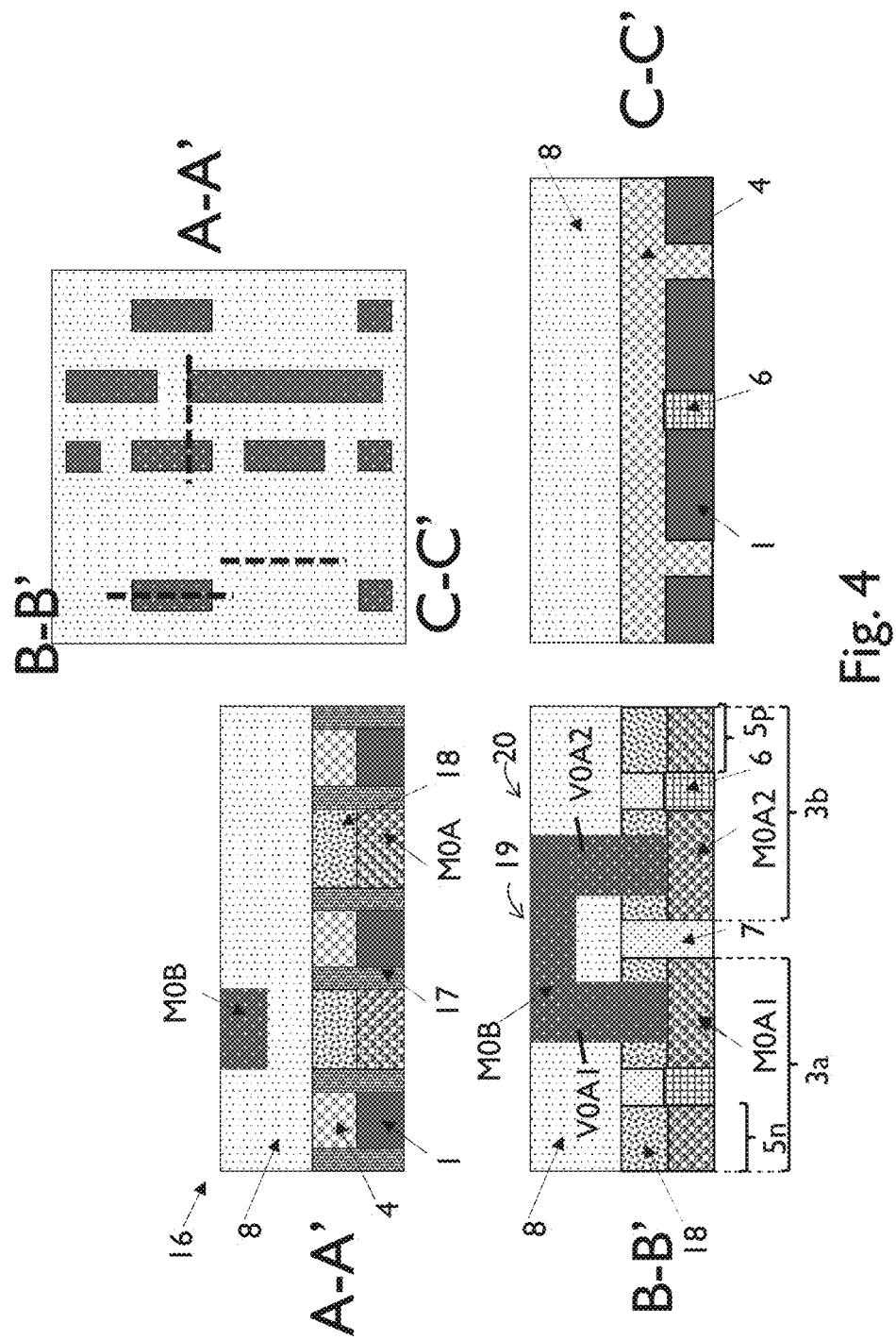

In FIG. 4, the first electrically conductive via (V0A1) is electrically connecting the first electrically conductive line (M0B) with a first electrically conductive contact (M0A1) on a first side, here the p-type side (5p), of a first transistor structure (3a) of the transistor structures (3a, 3b), while the second electrically conductive via (V0A2) is electrically connecting the first electrically conductive line (M0B) with a second electrically conductive contact (M0A2) on a first side, here an n-type side (5n), of a second transistor structure (3b) of the transistor structures (3a, 3b).

In at least some other embodiments, such as embodiments for a method of the first aspect of the disclosure, the first electrically conductive via (V0A1) is electrically connecting the first electrically conductive line (M0B) with a first electrically conductive contact (M0A1) on a first side, here the n-type side (5n), of a first transistor structure (3a) of the transistor structures (3a, 3b), while the second electrically conductive via (V0A2) is electrically connecting the first electrically conductive line (M0B) with a second electrically conductive contact (M0A2) on a first side, here also an n-type side (5n), of a second transistor structure (3b) of the transistor structures (3a, 3b).

In at least some other embodiments, such as embodiments for a method of the first aspect of the disclosure, the first electrically conductive via (V0A1) is electrically connecting the first electrically conductive line (M0B) with a first electrically conductive contact (M0A1) on a first side, here the n-type side (5n), of a first transistor structure (3a) of the transistor structures (3a, 3b), while the second electrically conductive via (V0A2) is electrically connecting the first electrically conductive line (M0B) with a second electrically conductive contact (M0A2) on a first side, here a p-type side (5p), of a second transistor structure (3b) of the transistor structures (3a, 3b).

In at least some other embodiments, such as embodiments for a method of the first aspect of the disclosure, the first electrically conductive via (V0A1) is electrically connecting the first electrically conductive line (M0B) with a first electrically conductive contact (M0A1) on a first side, here the p-type side (5p), of a first transistor structure (3a) of the transistor structures (3a, 3b), while the second electrically conductive via (V0A2) is electrically connecting the first electrically conductive line (M0B) with a second electrically conductive contact (M0A2) on a first side, here a p-type side (5p), of a second transistor structure (3b) of the transistor structures (3a, 3b).

The aforementioned embodiments can be starting points for providing the protection (11) selectively on the top surface of the first electrically conductive line (M0B).

Reference is now made to FIG. 1 to FIG. 4. In at least some embodiments described above, providing the semiconductor can includes providing a semiconductor structure (see FIG. 1) comprising two transistor structures (3a, 3b) separated by a dielectric separation (7). Each transistor structure (3a, 3b) comprises a pMOS side (5p) of a first doping type and an nMOS side (5n) of a second doping type. Each side forming a channel structure, a source portion, and a drain portion. The source portion and the drain portion can be horizontally separated by the channel structure. Additionally, the semiconductor structure comprises a gate structure on the channel structure. The gate structure comprises a gate electrode (1) and a gate plug (4). Further, the semiconductor structure comprises electrically conductive contacts (M0A) electrically coupled to the source portion and the drain portion of each side (5p, 5n) of each transistor structure (3a, 3b).

Providing the semiconductor can also include providing a first dielectric layer (8, FIG. 2) over the two transistor structures (3a, 3b), the gate structure, and the electrically conductive contacts (M0A). Providing the semiconductor can further include providing a first hard mask (9, FIG. 2) over the first dielectric layer (8), the first hard mask (9) having an opening (22) having its length extending along a first direction. The opening (22) extends above at least part of each transistor structure (3a, 3b). Additionally, providing the semiconductor can include etching partly through the first dielectric layer (8) by using the first hard mask (9) as a mask, thereby forming a trench (21, FIG. 2) which bottom is formed by the first dielectric layer (8). Even more, providing the semiconductor can include covering a central portion of the bottom with a second hard mask (not depicted), and etching two holes (23, FIG. 3), one on each side of the second hard mask, by using the first and second hard masks as masks, thereby exposing a first electrically conductive contact (M0A1) and a second electrically conductive contact (M0A2). Furthermore, providing the semiconductor can include removing the first hard mask (9, FIG. 4) and second hard mask. Furthermore still, providing the semiconductor can include filling both holes (23) and the trench (21) with an electrically conductive material, thereby forming a first electrically conductive line (M0B, FIG. 4), the first electrically conductive via (V0A1), and the second electrically conductive via (V0A2).

In at least embodiments, the two transistor structures (3a, 3b) can include two nanosheet transistor structures. Each nanosheet transistor structure can include two nanosheet stacks. One stack forms the pMOS side (5p) of a first doping type, and another stack forms the nMOS side (5n) of a second doping type. Each side (5p, 5n) can include a plurality of vertically stacked nanosheets. The plurality of vertically stacked nanosheets forms a channel structure, a source portion, and a drain portion. The source portion and the drain portion can be horizontally separated by the channel structure.

In at least some embodiments, the two transistor structures (3a, 3b) can be two forksheet transistor structures (3a, 3b), wherein the pMOS side (5p) of a first doping type and the nMOS side (5n) of a second doping type are separated by a dielectric wall (6). Each side (5p, 5n) comprises a plurality of vertically stacked nanosheets. The plurality of vertically stacked nanosheets form a channel structure, a source portion, and a drain portion. The source portion and the drain portion being horizontally separated by the channel structure. Each nanosheet having one side touching the dielectric wall. Such transistor structures are called forksheet transistor structures. This arrangement can provide more space for the active devices than if nanosheets are used. Indeed, the p-n separation takes significantly less place if forksheet transistor structures (3a, 3b) are used. One reason for this is the presence of the dielectric wall (6) between the nMOS and the pMOS.

In at least some embodiments, the dielectric separation (7) can be made of silicon dioxide ($SiO_2$).

In at least some embodiments, the gate can comprise a gate metal (1) such as tungsten (W). Above the gate metal (1), a gate plug (4) can be present. For this gate plug (4), for instance, silicon nitride ($Si_3N_4$) can be used. Gate spacers (17) on both sides of the gate can be present. As an example, the gate spacers (17) can be made of $Si_3N_4$ or silicon oxycarbide. An example of a gate structure is visible in FIG. 4 (1, 4, 17).

As an example, the source and the drain electrically conductive contacts (M0A1, M0A2) can for instance be silicon-germanium:boron (SiGe:B) (p-MOS) or silicon: phosphorous (Si:P) (n-MOS).

Returning to FIG. 1, an example presence of a first active plug (18) above and in physical contact with the first electrically conductive contact (M0A1) and of a second active plug (18) above and in physical contact with the second electrically conductive contact (M0A2) is shown. The top surface of the active plug (18) is coplanar with the top surface of the gate spacers (17) and of the gate plug (4). The active plugs (18) can be formed of a dielectric material such as SiO2. The SiO2 can, for instance, be deposited by plasma enhanced atomic layer deposition.

In at least some embodiments, the first electrically conductive line (M0B) can be embedded in a dielectric layer (8). Moreover, in at least some embodiments, the first electrically conductive line (M0B) can be provided as part of a set of parallel first electrically conductive lines (M0B), all arranged within a first metallization level and each extending along a same first direction.

As an example, the set of first electrically conductive lines (M0B) can be arranged at a pitch of from 20 nanometers (nm) to 60 nm. As another example, the set of first electrically conductive lines (M0B) can be arranged at a pitch of from 30 nm to 50 nm. As yet another example, the set of first electrically conductive lines (M0B) can be arranged at a pitch of from 35 nm to 45 nm. As still yet another example, the set of first electrically conductive lines (M0B) can be arranged at a pitch of from 37 nm to 41 nm. And, as still yet another example, the set of first electrically conductive lines (M0B) can be arranged at a pitch of from 38 to 40 nm. With the pitch being relatively large, there is enough space between the set of first electrically conductive lines (M0B) to eventually form the via (VintG) electrically connected with a gate (1).

In at least some embodiments, the planar dielectric layer (8) can be $SiO_2$.

In at least some embodiments, each of the first electrically conductive line (M0B) and the first and second electrically conductive vias (V0A1, V0A2) can be made of a metal independently selected from metals such as copper (Cu), molybdenum (Mo), ruthenium (Ru), or W, among others.

As noted above, in at least some embodiments, the method includes providing a protection (11) selectively on the top surface of the first electrically conductive line (M0B). Aspects of such embodiments are now discussed with respect to FIG. 5 to FIG. 7.

The protection (11) may be a dielectric protection. In some embodiments where the protection (11) is provided and where the first electrically conductive line (M0B) is made of W or Mo, the protection (11) may be selected from dielectric materials, Cu, and Ru. Cu and Ru tend to be more resistant to recessing conditions used in recessing the first dielectric layer (8), as discussed above. Cu and Ru can be significantly more resistant than W or Mo to fluorine-based plasma.

Figure 5:
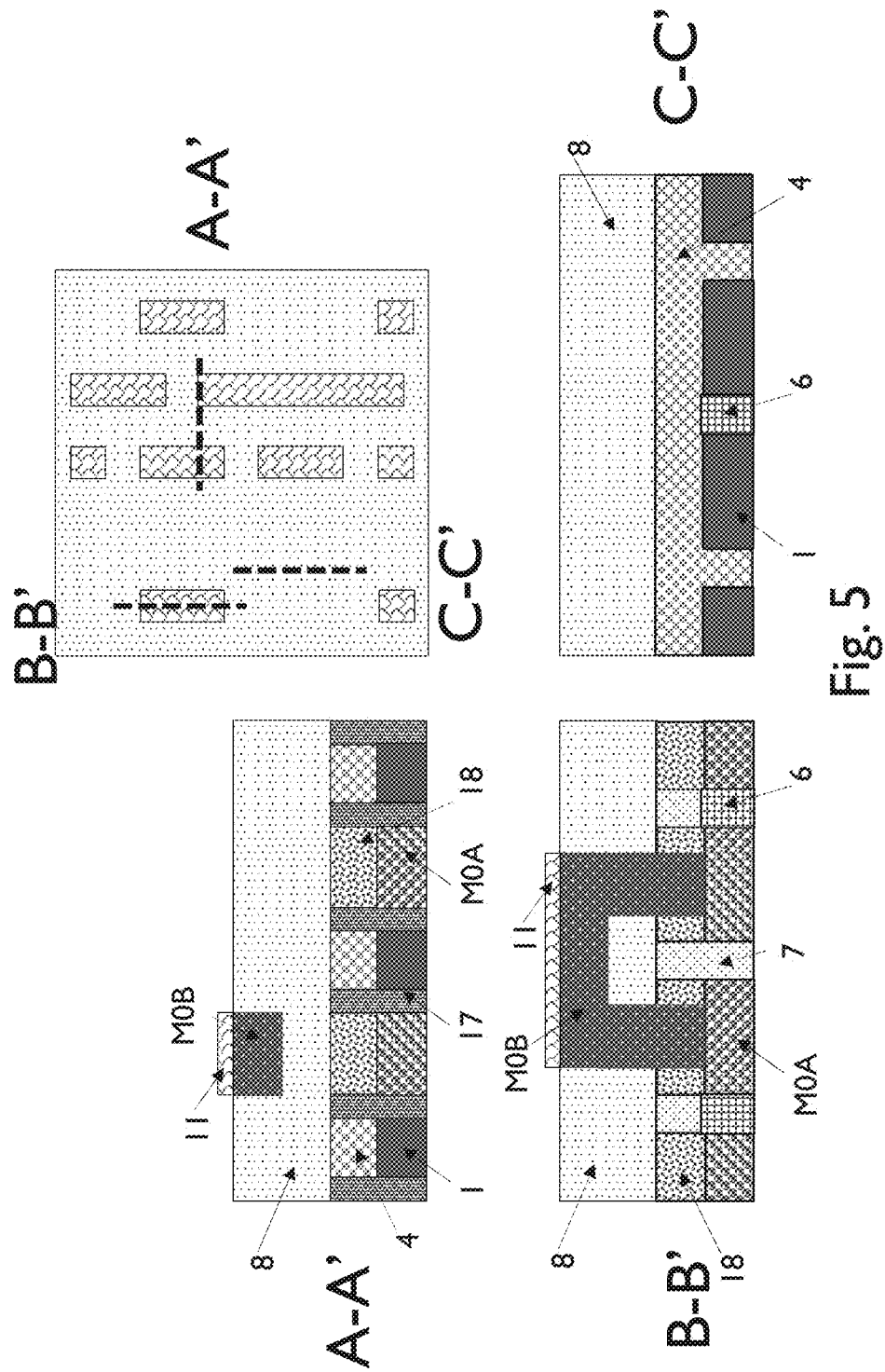

Referring to FIG. 5, in at least some embodiments, the protection (11) may be selected from titanium oxide (TiOx) (e.g., titanium dioxide ($TiO_2$), silicon oxycarbide, silicon nitride, or even Cu or Ru if the first electrically conductive line (M0B) is made of W or Mo.

Figure 6:
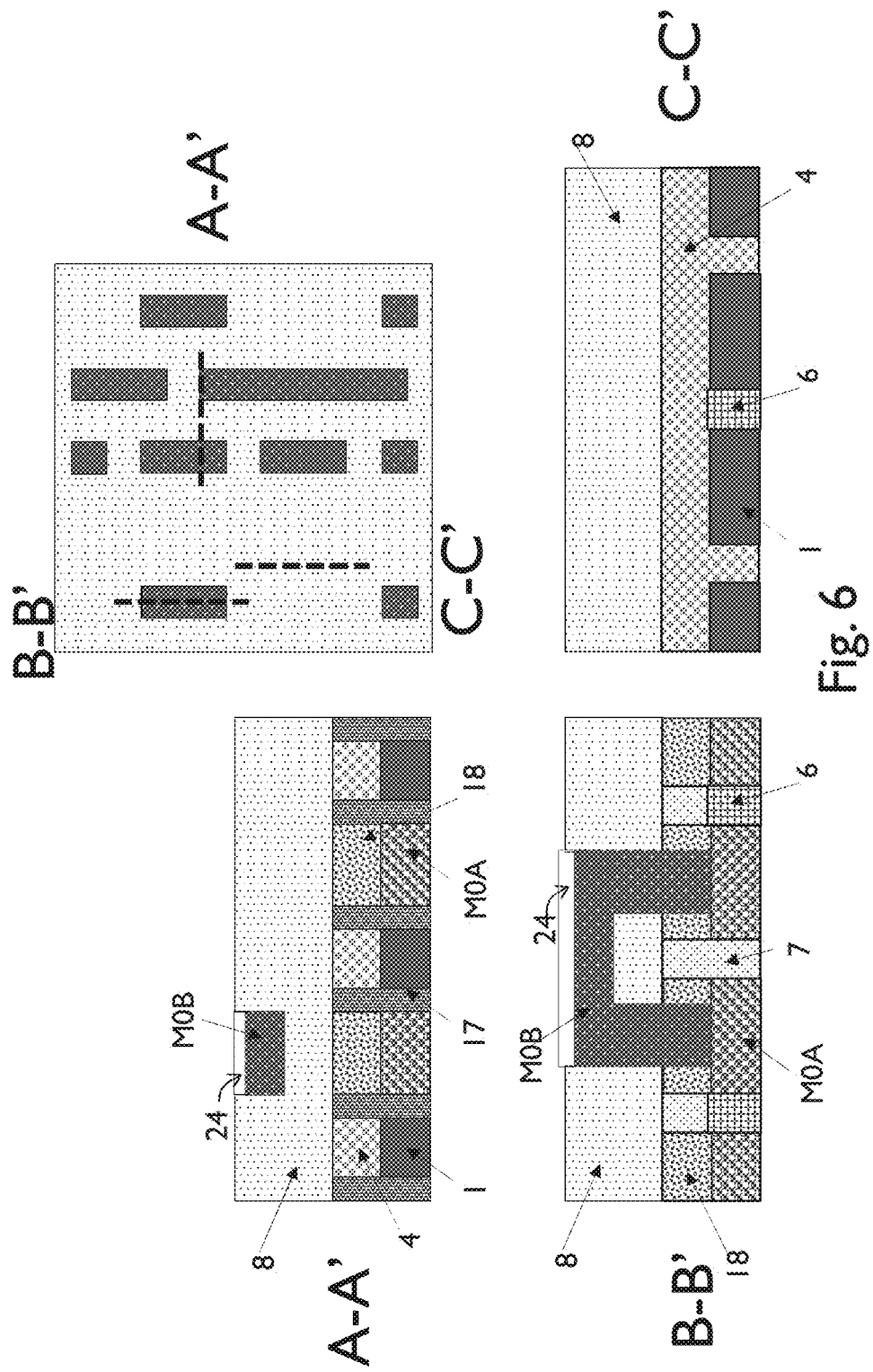
Figure 7:
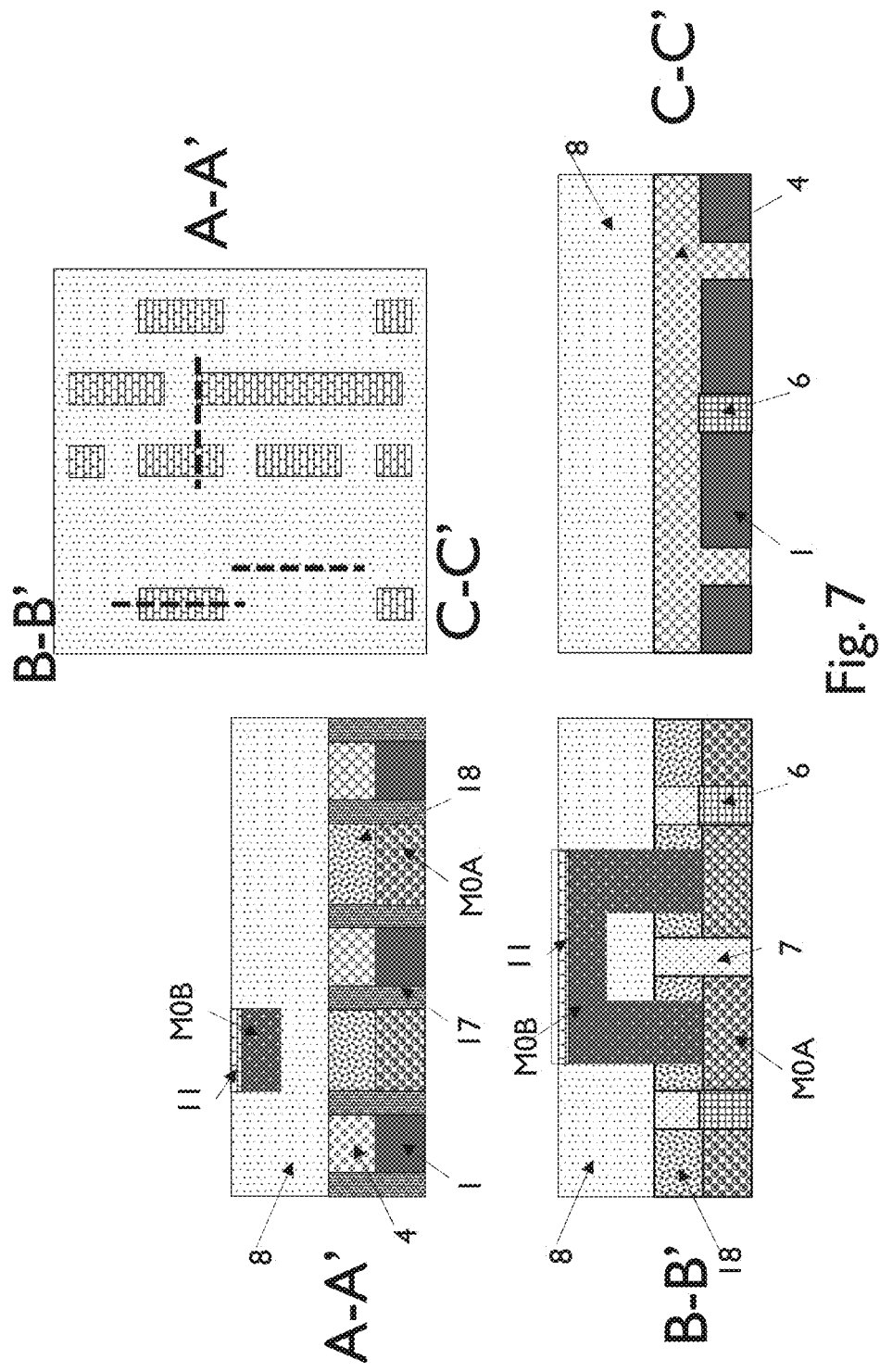
Figure 8:
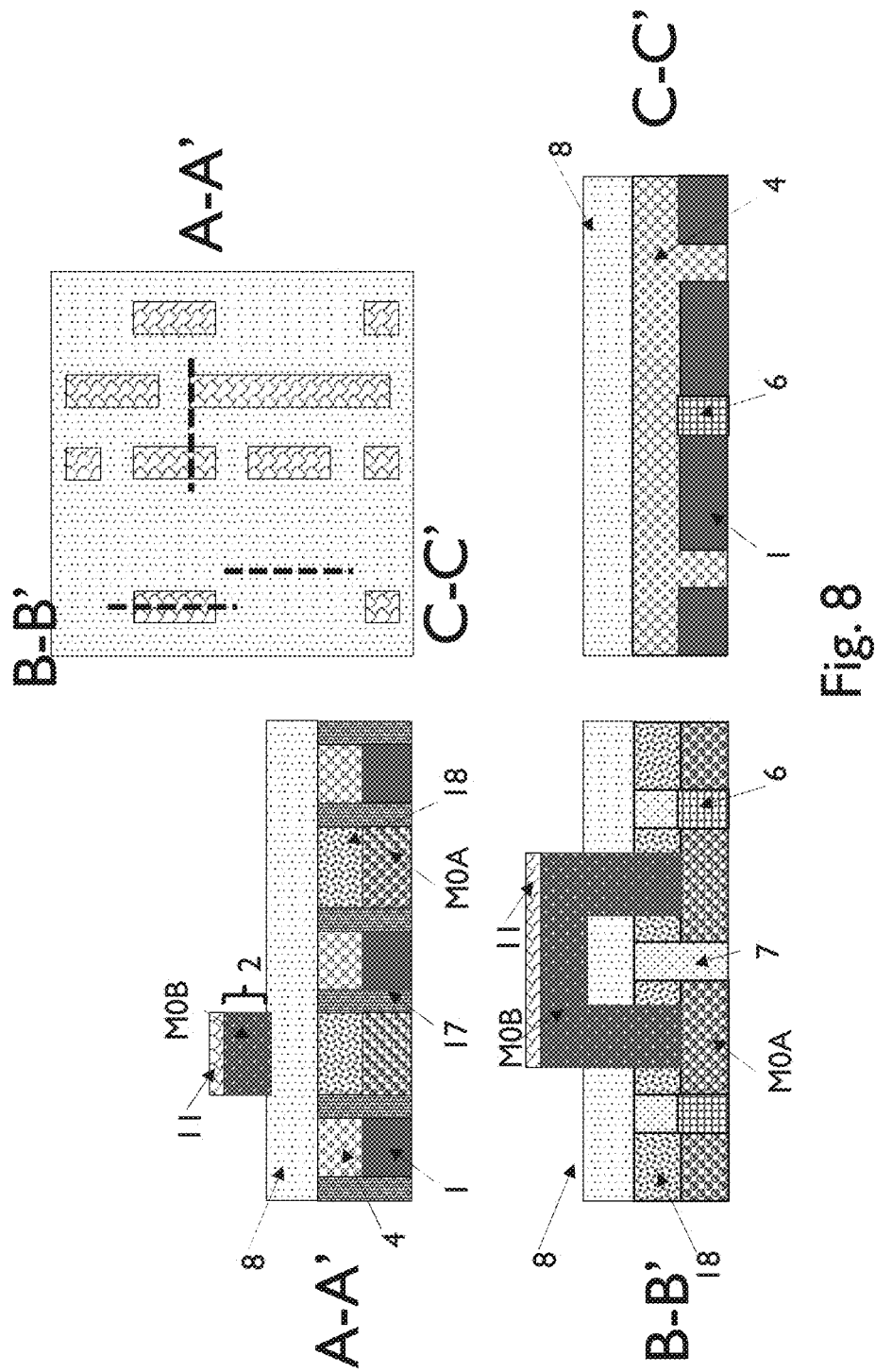
Figure 9:
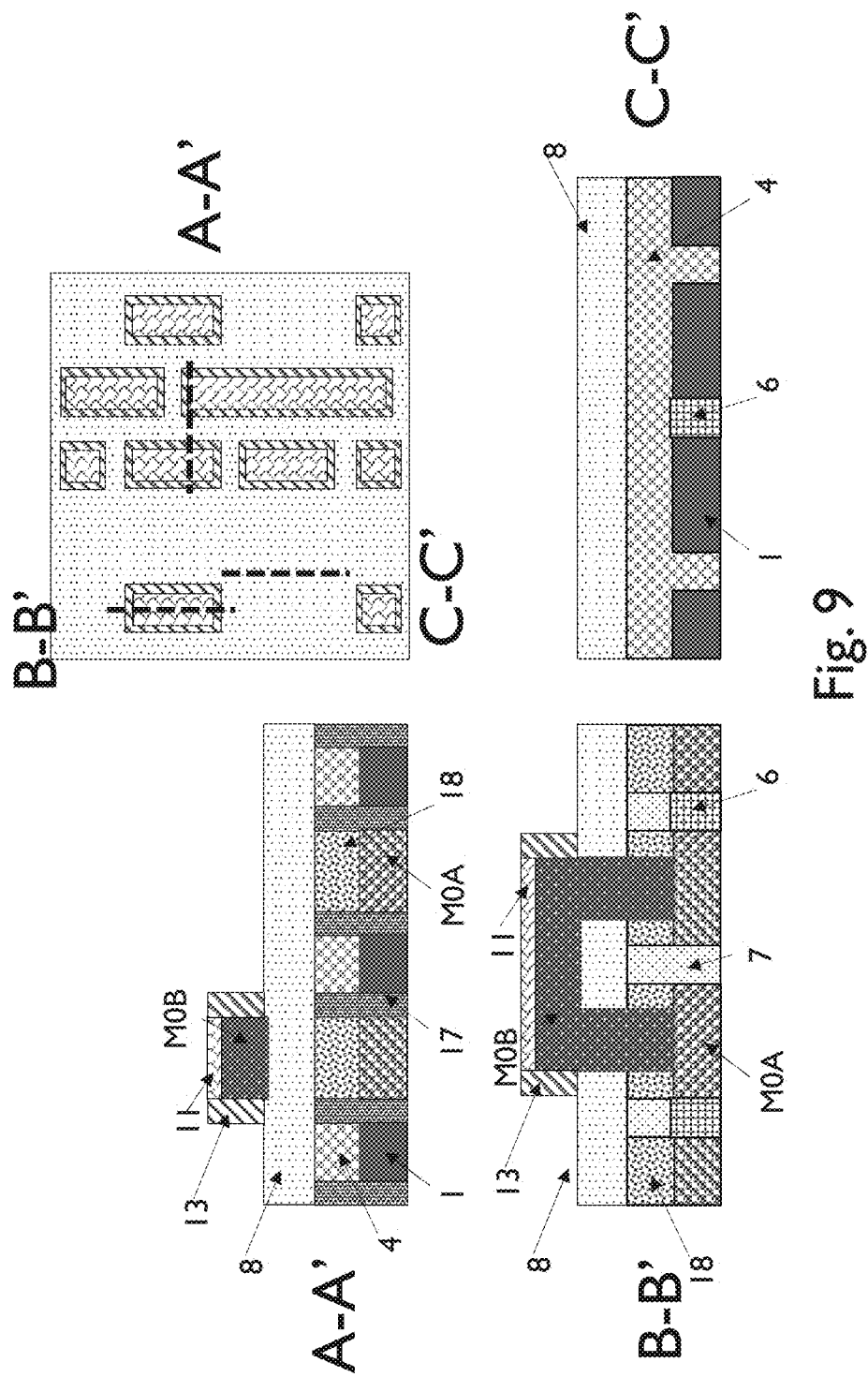
Figure 10:
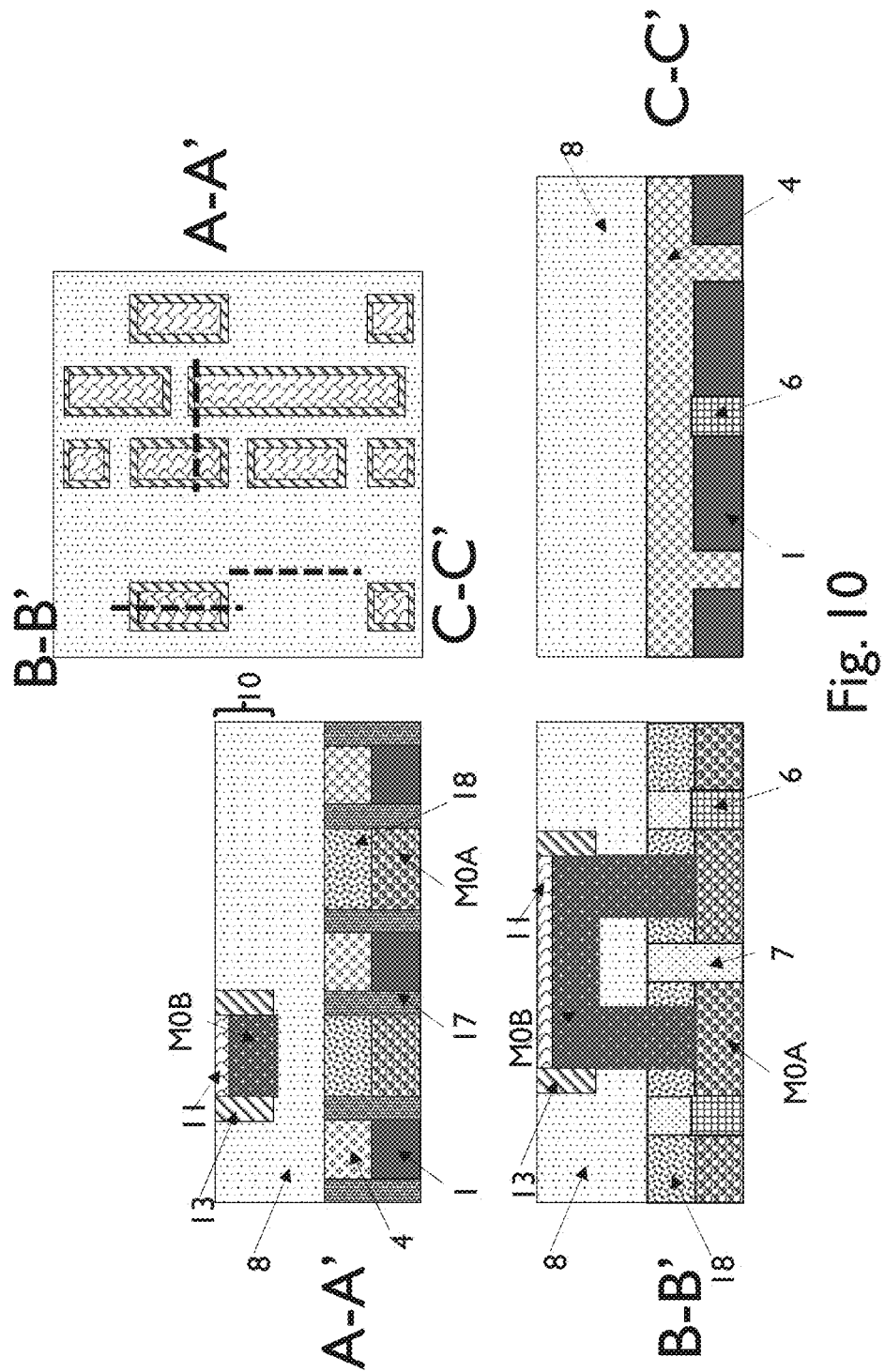
Figure 11:
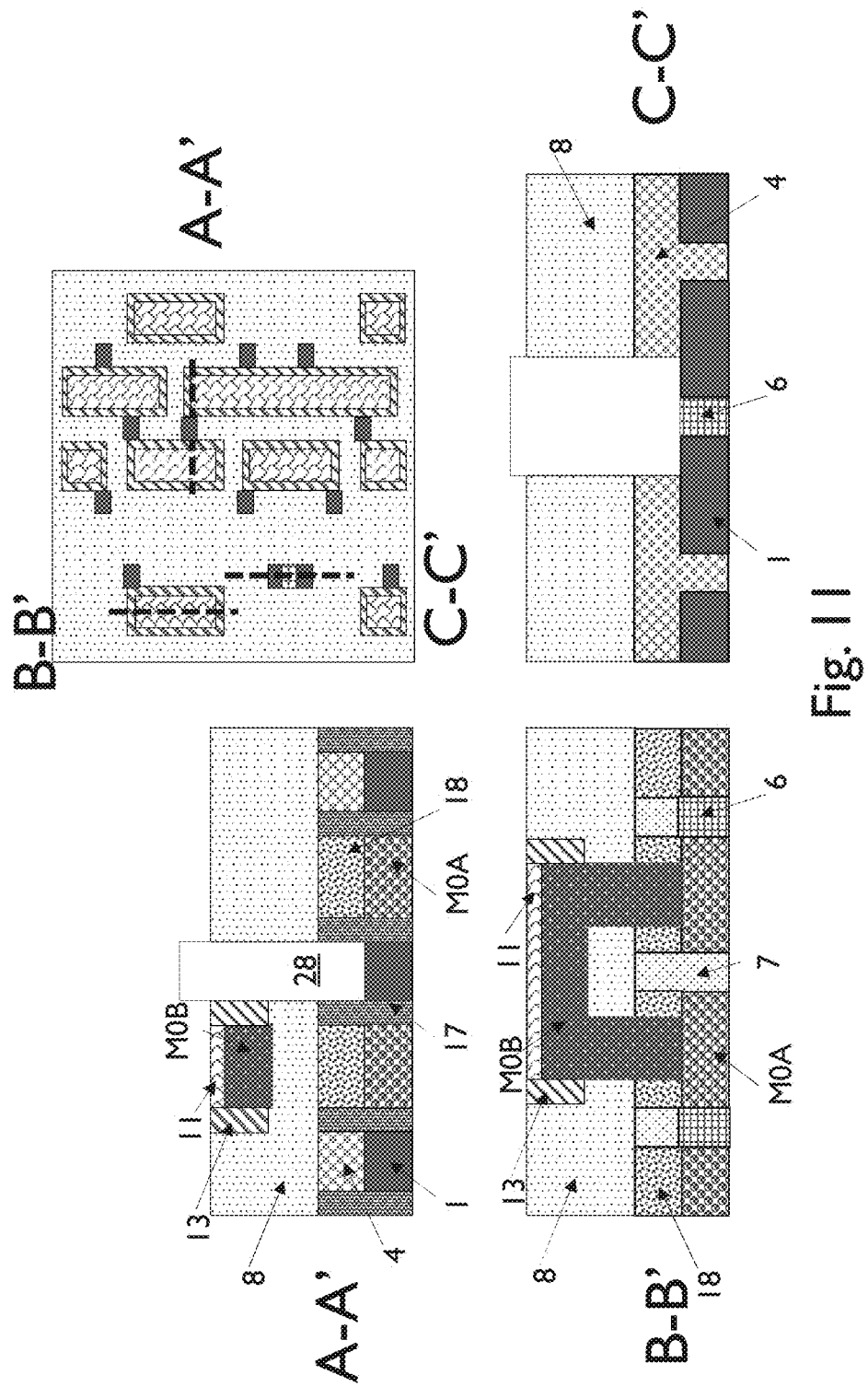
Figure 12:
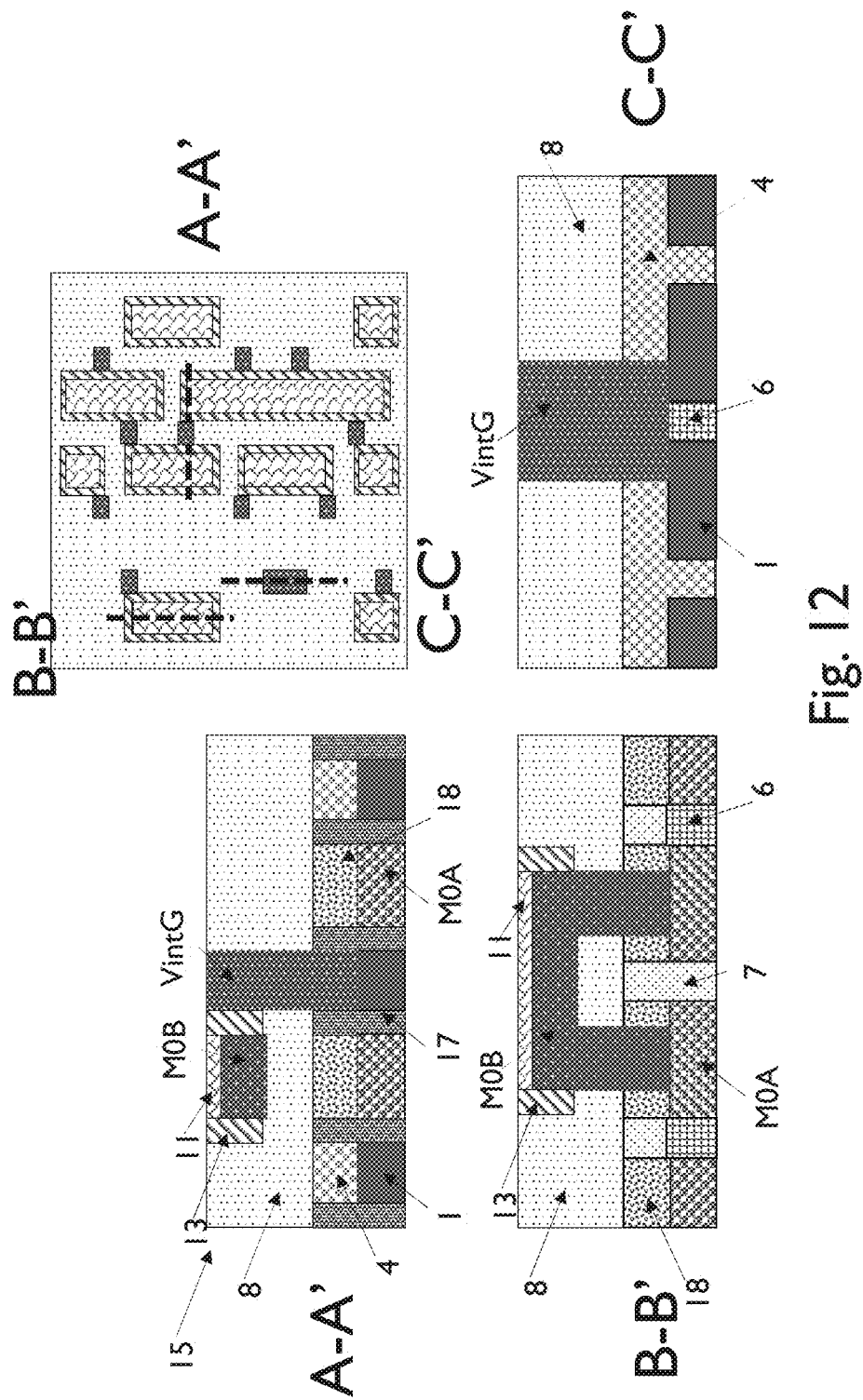
Figure 13:
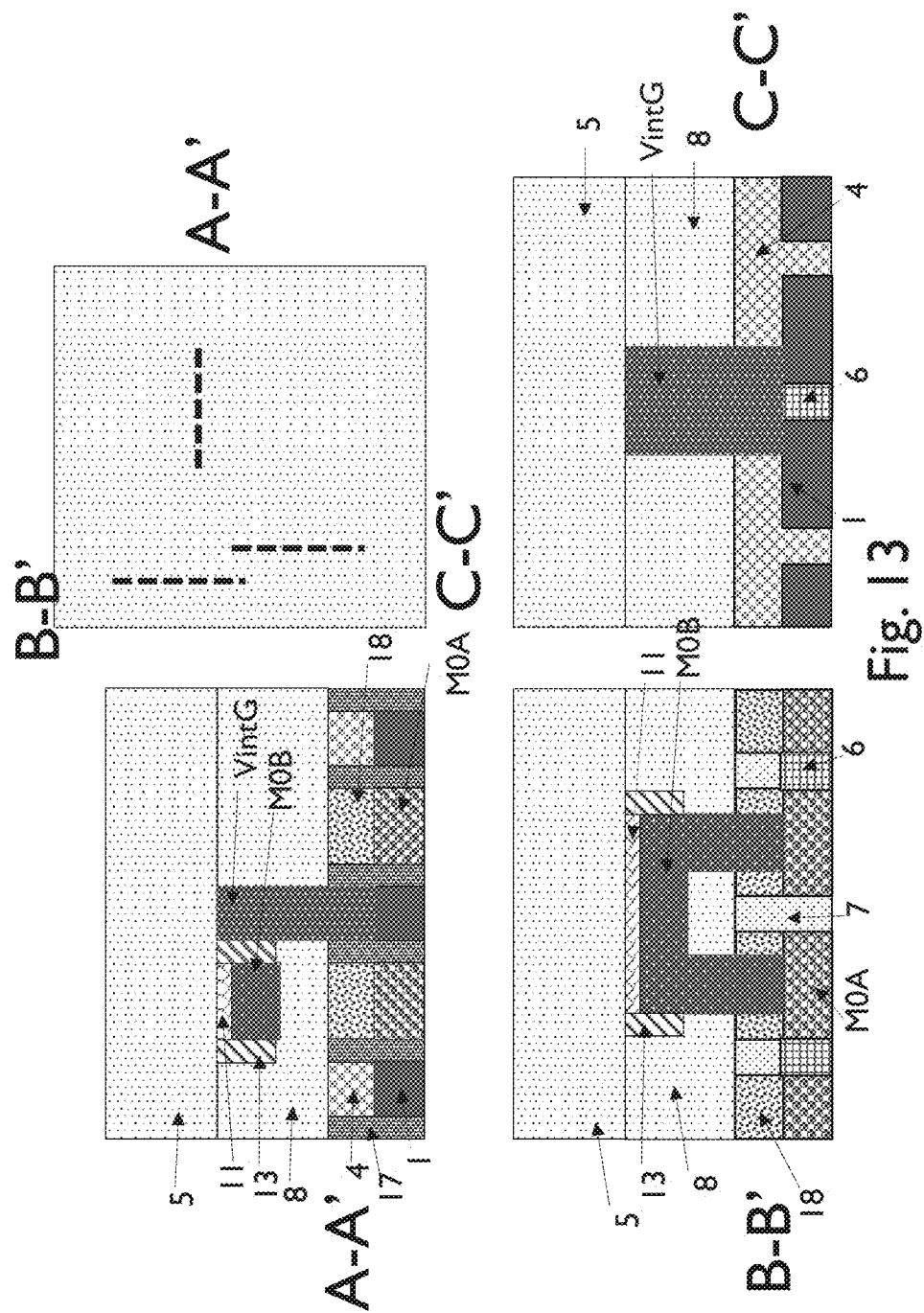
Figure 14:
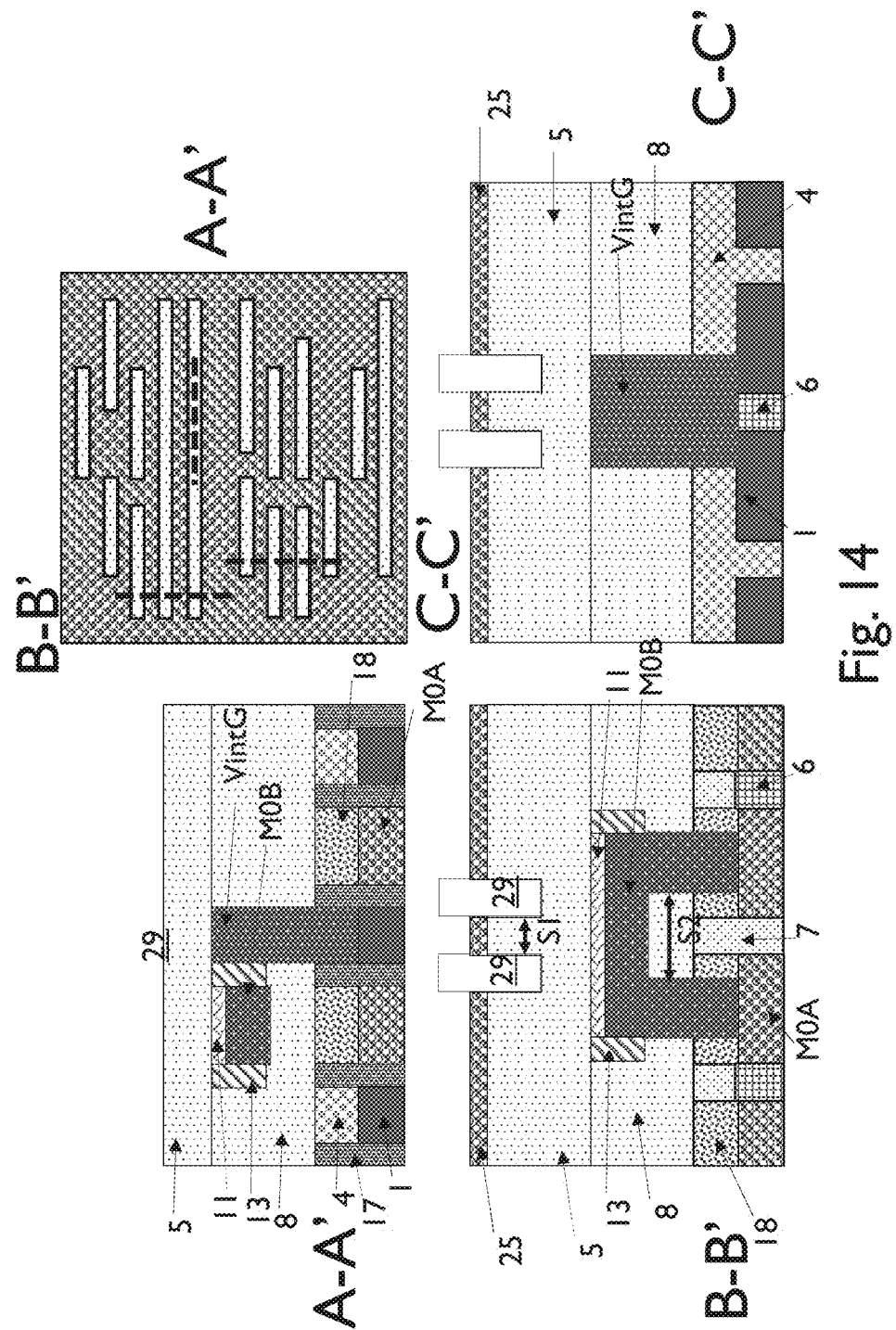
Figure 15:
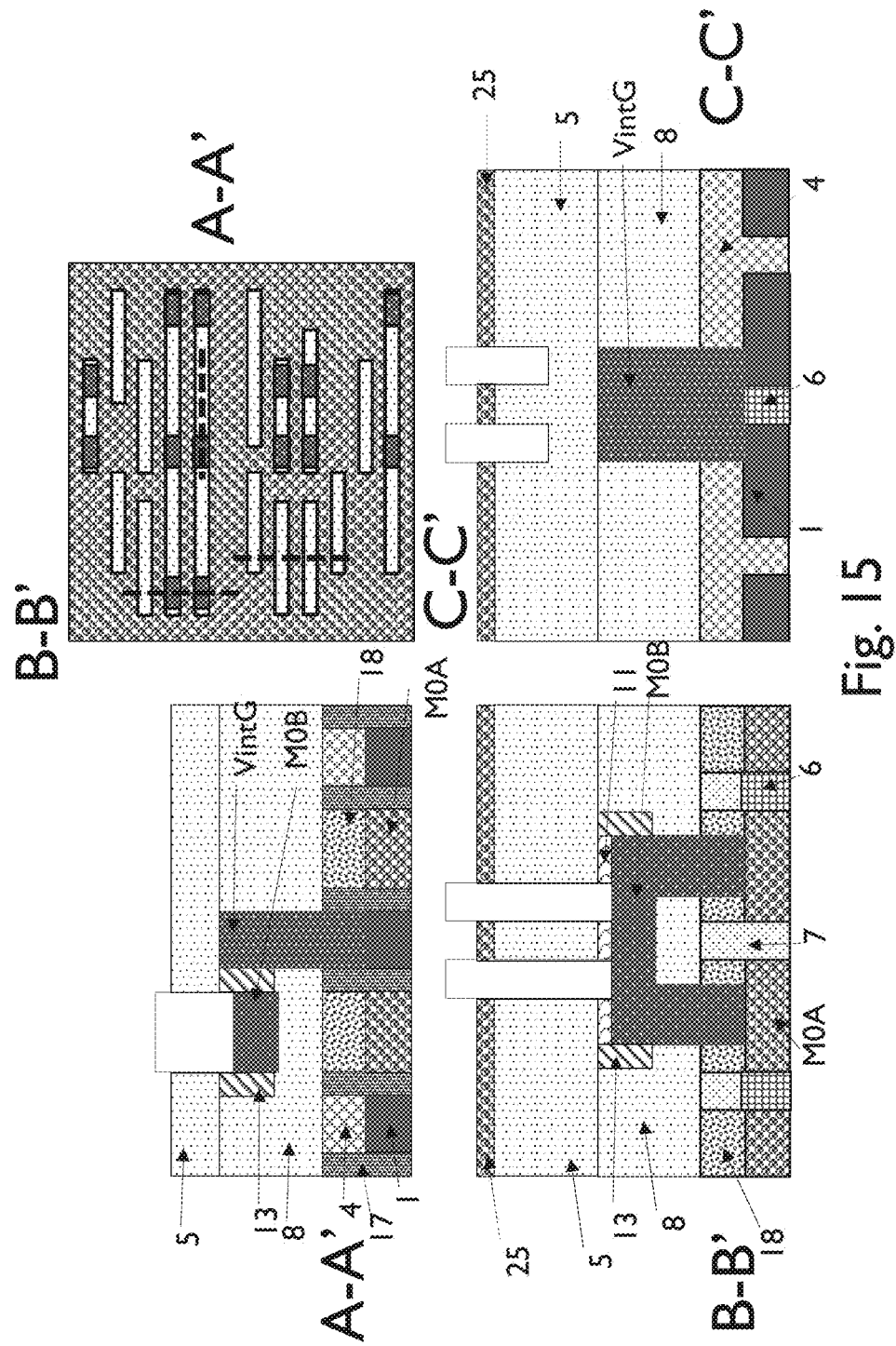
Figure 16:
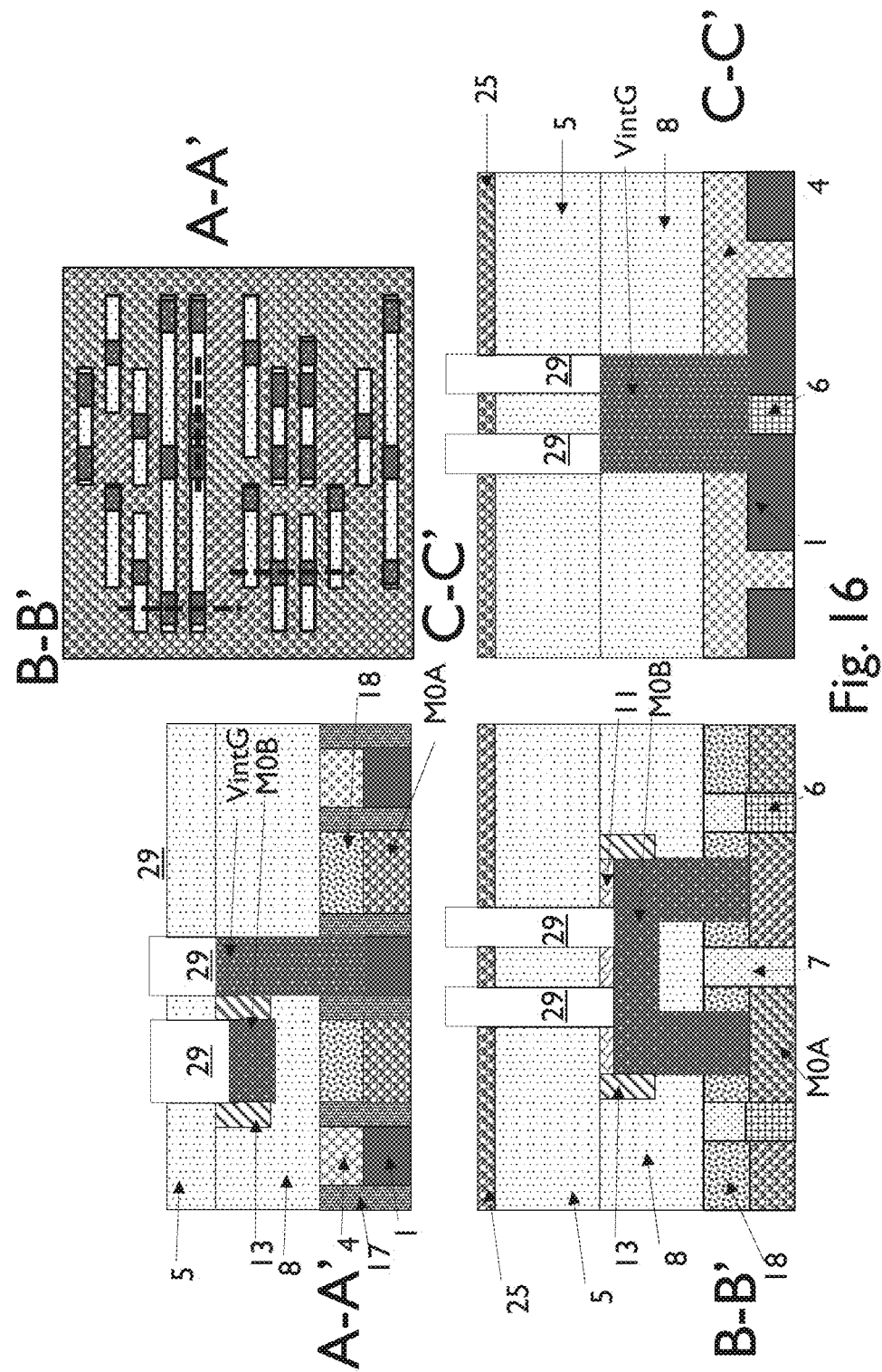
Figure 17:
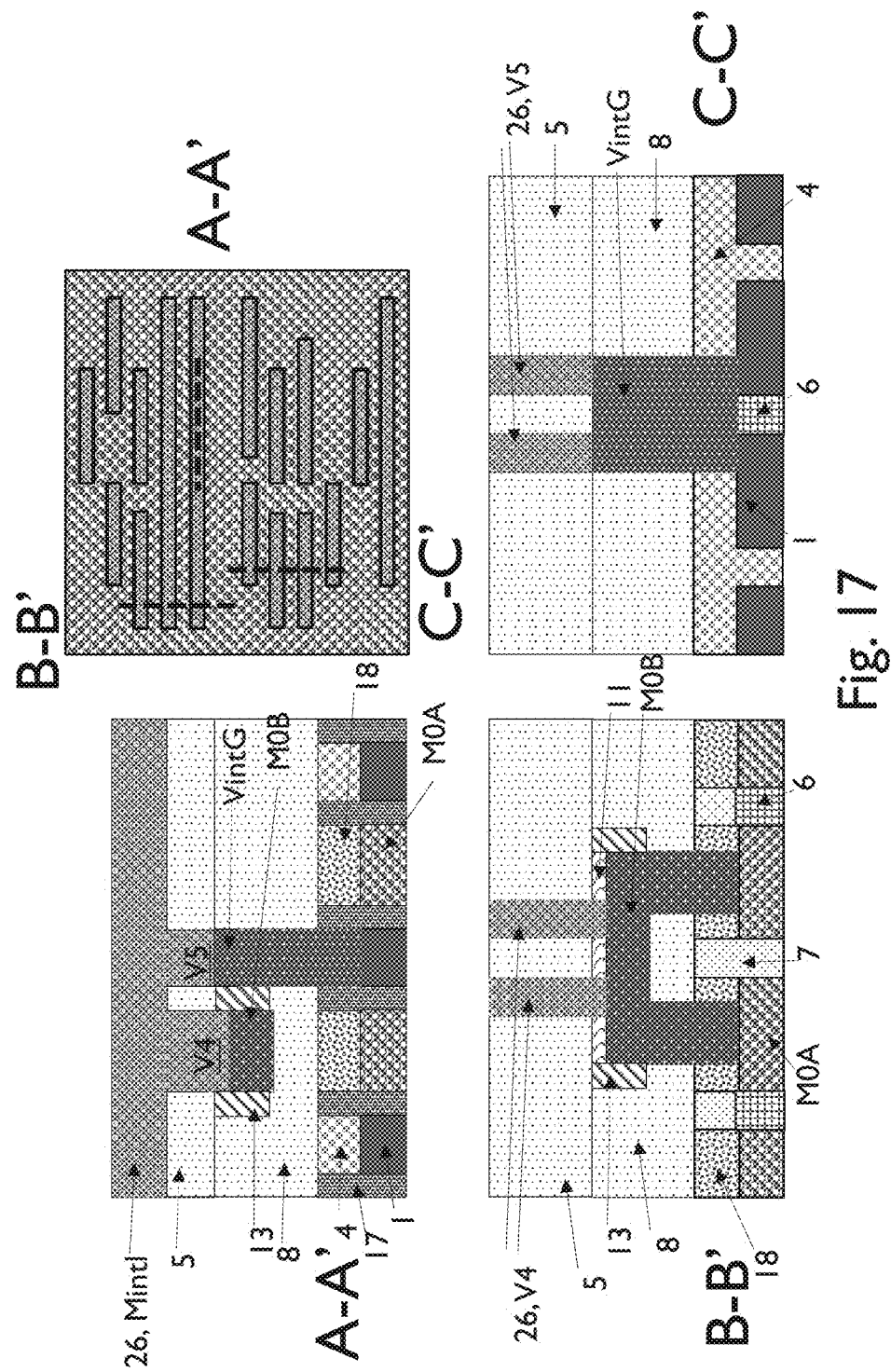
Figure 18:
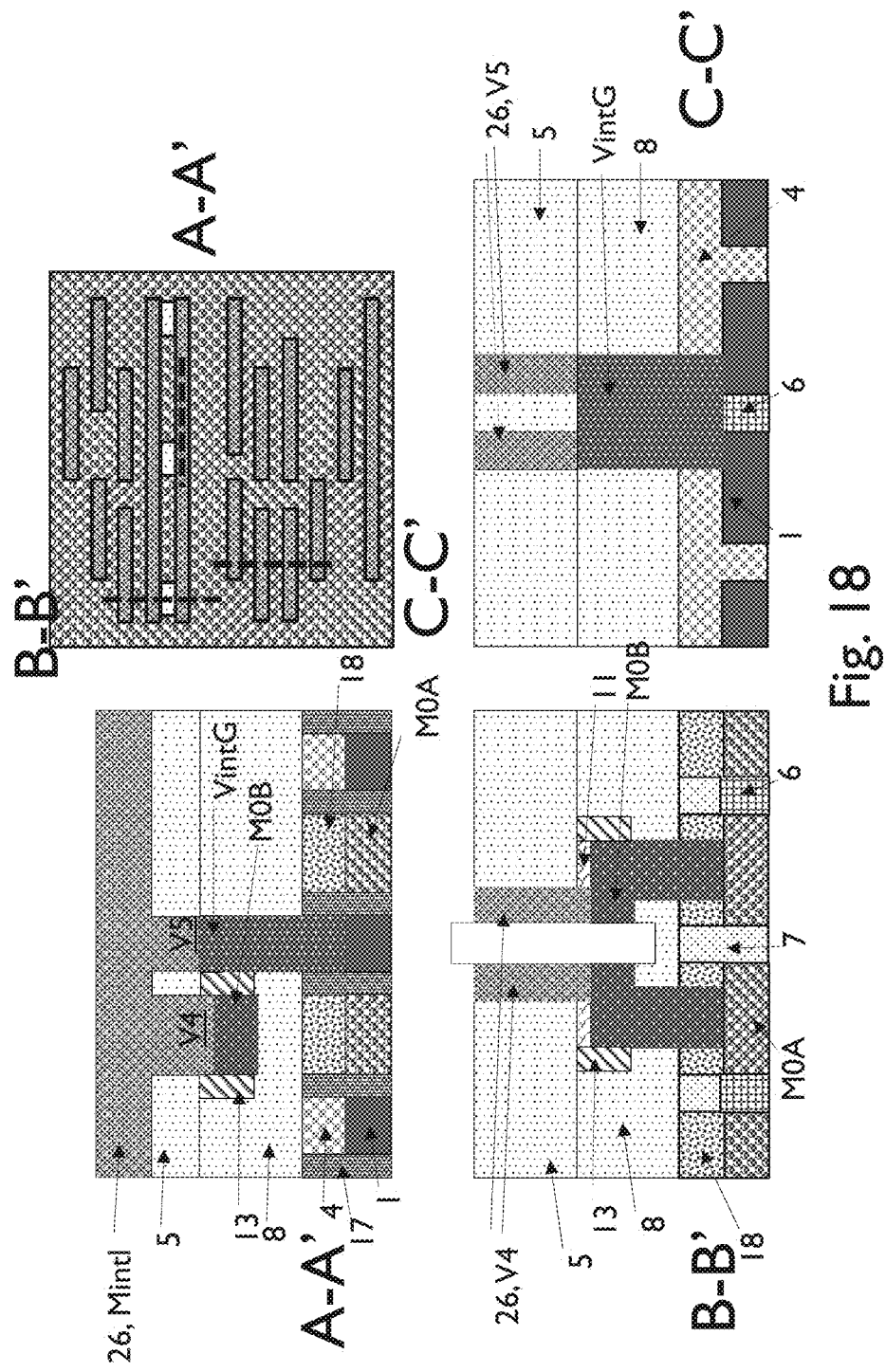
Figure 19:
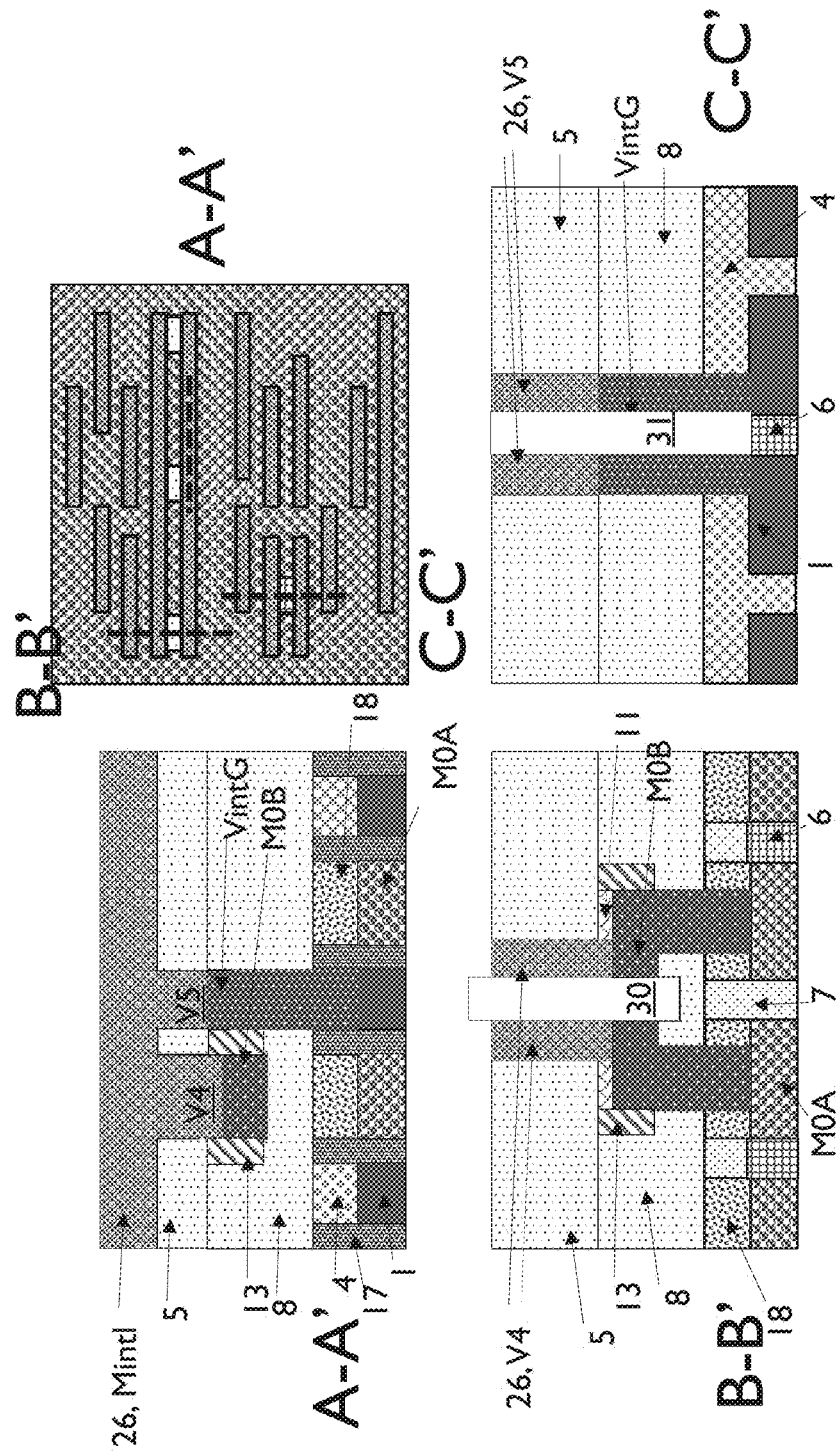

In at least some embodiments, such as embodiments related to FIG. 6 and FIG. 7, a protection (11) selectively on a top surface of the first electrically conductive line (M0B) is provided. As shown in FIG. 6, these embodiments can include partially recessing the first electrically conductive line (M0B) and, as shown in FIG. 7, the protection (11) can be provided in the recess (24) in such a way that a top surface of the protection (11) is coplanar with a top surface of the first dielectric layer (8).

In at least some embodiments, the protection (11) selectively on a top surface of the first electrically conductive line (M0B) is provided, and providing the protection comprises partially recessing the first electrically conductive line (M0B), and providing the protection (11) in the recess (24) in such a way that a top surface of the protection (11) is coplanar with a top surface of the first dielectric layer (8).

In at least some embodiments, the protection (11) is not provided on a top surface of the first electrically conductive line (M0B) because the material forming the first electrically conductive line (M0B) is different from the material forming the first dielectric layer (8), thereby allowing finding some recessing conditions with some selectivity toward the dielectric layer (8) with respect to the first electrically conductive line (M0B). If the first electrically conductive line (M0B) is W or Mo and the dielectric layer (8) is a silicon oxide, selectivity might in some case be insufficient, at least if a fluorine-based plasma is used for recessing the first dielectric layer (8). In such a case, the protection (11) is preferably used. If the first electrically conductive line (M0B) is Cu or Ru and the dielectric layer (8) is a silicon oxide, selectivity will typically be sufficient if a fluorine-based plasma is used. However, also in this case, the protection (11) could be used. Recessing the first dielectric layer (8) can for instance be performed with a fluorine-containing plasma, e.g., a sulfur hexafluoride ($SF_6$), carbon tetrafluoride ($CF_4$), trifluoromethane ($CHF_3$), or $C_4F$ containing plasma.

In at least some embodiments, the spacers (13) can be made of silicon nitride, silicon carbon nitride, silicon carbon oxynitride, or silicon oxycarbide.

In at least some embodiments, the spacers (13) can have a thickness of from 3 nm to 9 nm. As another example, the spacers (13) can have a thickness of from 4 nm to 8 nm. As yet another example, the spacers (13) can have a thickness of from 5 nm to 7 nm.

Reference is now made to FIG. 13 to FIG. 20. In at least some embodiments related to FIG. 13 to FIG. 20, a method can further include providing a third dielectric layer (5, FIG. 13) on the second dielectric layer (10), the top surface of the spacers (13), a top surface of the third electrically conductive via (VintG), and either the top surface of the first electrically conductive line (M0B) if the protection (11) is not provided or the top surface of the protection (11) if the protection (11) is provided.

In at least some embodiments related to FIG. 13 to FIG. 20, a method can further include providing a hard mask (25, FIG. 14) on a top surface of the third dielectric layer (5). The hard mask (25) having two openings (29). A separation (S1) between both openings (29) being smaller than a space (S2) between the first electrically conductive via (V0A1) and the second electrically conductive via (V0A2). The separation (S1) being directly above the space (S2) between the first electrically conductive via (V0A1) and the second electrically conductive via (V0A2). One of the openings (29) laterally overlapping with the third electrically conductive via (VintG).

In at least some embodiments related to FIG. 13 to FIG. 20, a method can further include etching through the third dielectric layer (5) and through the protection (11) if present by using the hard mask (25) as a mask, thereby forming two longitudinal openings (29, see FIG. 14 to FIG. 16) extending along a second direction, typically perpendicular to the first direction. Each of the longitudinal openings (29) exposes the first electrically conductive line (M0B) and the third electrically conductive via (VintG) by means of respectively a first and a second via hole communicating with the longitudinal openings (29).

In at least some embodiments related to FIG. 13 to FIG. 20, a method can further include providing an electrically conductive material (26, FIG. 17) in the two longitudinal openings (29). This can result in forming two second electrically conductive lines (Mintl1, Mintl2) arranged within a second metallization level, and extending along the second direction, separated by the separation S1. This can also result in forming two fourth electrically conductive vias (V4), one of them being directly physically connected to one of the two second electrically conductive lines (Mintl) and to the first electrically conductive line (M0B), the other one being directly physically connected to the other of the two second electrically conductive lines (Mintl) and to the first electrically conductive line (M0B). This can also result in forming two fifth electrically conductive vias (V5), one of them being directly physically connected to one of the two second electrically conductive lines (Mintl) and to the third electrically conductive via (VintG), the other one being directly physically connected to the other of the two second electrically conductive lines (Mintl) and to the third electrically conductive via (VintG).

In at least some embodiments related to FIG. 13 to FIG. 20, a method can further include etching (see FIG. 18) between both fourth electrically conductive vias (V4), through the entire thickness of the first electrically conductive line (M0B), by using both fourth electrically conductive vias as masks, thereby cutting the first electrically conductive line (M0B), thereby forming a first interruption (30) within the first electrically conductive line (M0B).

In at least some embodiments related to FIG. 13 to FIG. 20, a method can further include etching (see FIG. 19) between both fifth electrically conductive vias (V5), through the entire thickness of the third electrically conductive via (VintG), by using both electrically conductive vias as masks, thereby cutting the third electrically conductive via (VintG), thereby forming a second interruption (31) within the third electrically conductive via (VintG).

In at least some embodiments, the etching through the third dielectric layer (5) and through the protection (11) if present by using the hard mask (25) can include etching through the third dielectric layer (5) by using the hard mask (25) as a mask, thereby forming two longitudinal openings (29, see FIG. 14) extending along a second direction, typically perpendicular to the first direction. The etching can also include masking with a mask (e.g., a trilayer spin-on-glass (SOG)/spin-on-carbon (SOC)/photoresist) sections of the two longitudinal openings that do not overlap with the first electrically conductive line (M0B). The etching can further include etching through the third dielectric layer (5), and through the protection (11) if present, by using the mask provided in step (ii) and the hard mask (25) as mask, thereby exposing the first electrically conductive line (M0B) by means of a first via hole communicating with the longitudinal openings (29). Furthermore, the etching can include masking with a mask (e.g., a trilayer SOG/SOC/photoresist) sections of the two longitudinal openings that do not overlap with the third electrically conductive via (VintG). Furthermore still, the etching can include etching through the third dielectric layer (5) by using the mask provided in step (iv) and the hard mask (25) as a mask, thereby exposing the third electrically conductive via (VintG) by means of second via hole communicating with the longitudinal openings (29).

Figure 20:
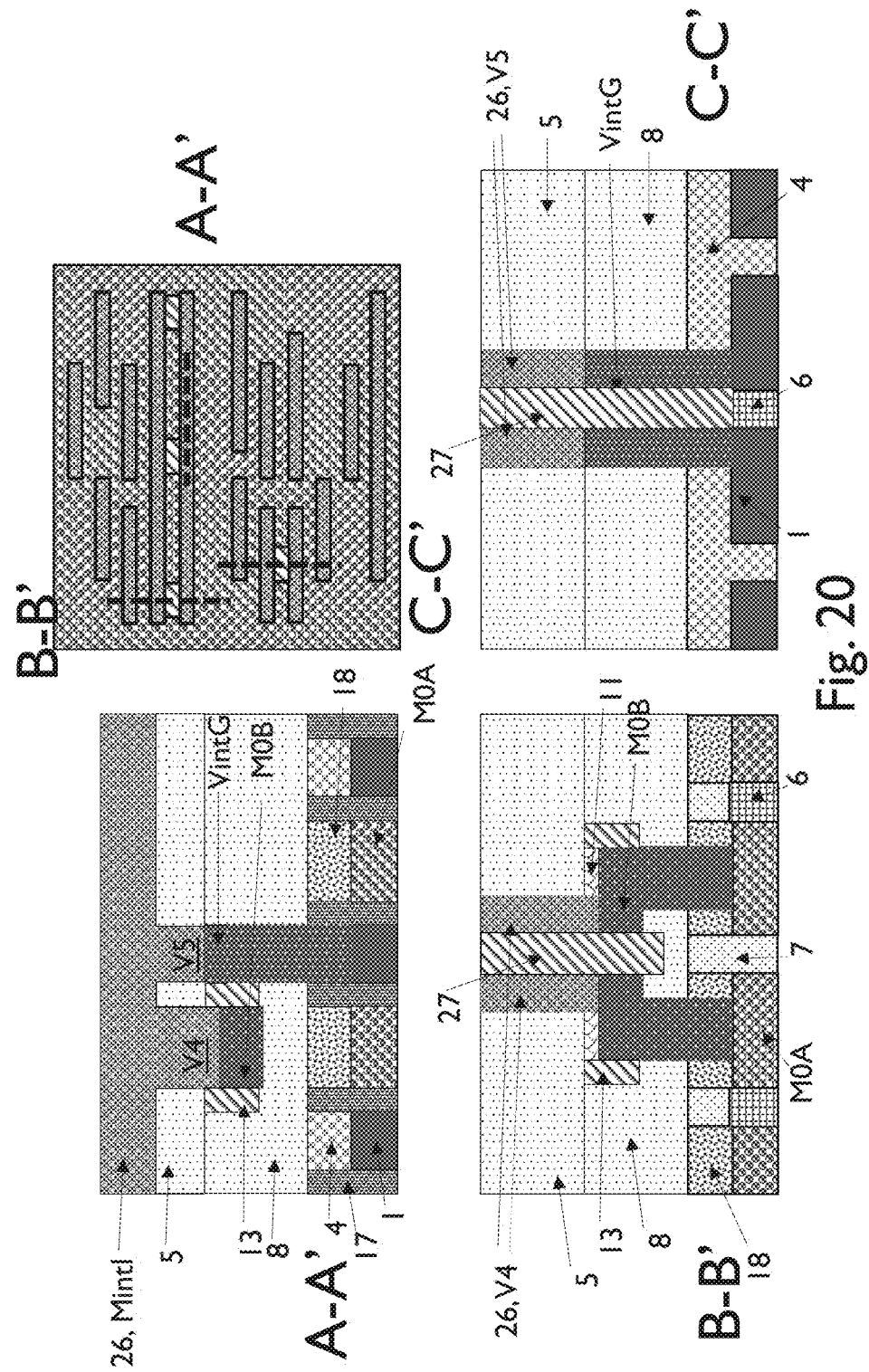
Figure 21:
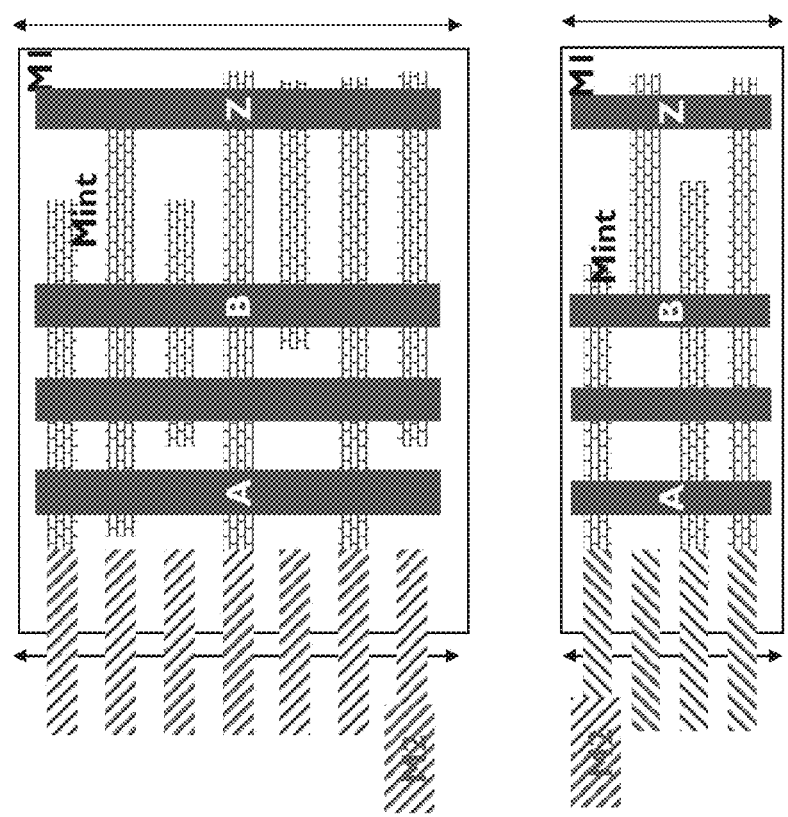
FIG. 21 is a top view of two schematized standard cells according to the prior art.

In at least some embodiments, after etching between both fifth electrically conductive vias (V5), the method can further comprise filling the first interruption (30) and the second interruption (31) with a dielectric material (27, FIG. 20).

In at least some embodiments, after etching between both fifth electrically conductive vias (V5), or after etching between both fifth electrically conductive vias (V5) and filling the first interruption (30) and the second interruption (31) with a dielectric material (27), the method can further comprise forming, above the second metallization level, a set of third electrically conductive lines (M11) arranged within a third metallization level, and extending along the first direction, and forming a via (V1) electrically connecting a third electrically conductive line (M11) with a second electrically conductive line (Mintl).

In at least some embodiments, the method of the first aspect discussed above can be for forming a standard cell of the integrated circuit.

In at least some embodiments, the standard cell can comprise four second electrically conductive lines (Mintl) and more than four third electrically conductive lines (M11).

The etching respectively between both fourth electrically conductive vias (V4) and both fifth electrically conductive vias (V5) can be performed by any suitable method. For instance, if both fourth electrically conductive vias (V4) and both fifth electrically conductive vias (V5) are made of Ru, etching can be performed by plasma etching using chlorine ($Cl_2$) and/or oxygen ($O_2$) and $Cl_2$ as etchant gas in an inductively coupled plasma etching chamber.

In at least some embodiments, the set of second electrically conductive lines (Mintl) can be arranged at a pitch of from 9 nm to 30 nm. As another example, the set of second electrically conductive lines (Mintl) can be arranged at a pitch of from 11 nm to 25 nm. As yet another example, the set of second electrically conductive lines (Mintl) can be arranged at a pitch of from 14 nm to 22 nm. As still yet another example, the set of second electrically conductive lines (Mintl) can be arranged at a pitch of from 16 nm to 20 nm. And as yet another example, the set of second electrically conductive lines (Mintl) can be arranged at a pitch of from 18 nm to 20 nm.

In at least some embodiments, the set of second electrically conductive lines (Mintl) can be arranged at a pitch and the width of the first interruption (30) as well as the width of the second interruption (31) are equal to 0.5 times the pitch.

In at least some embodiments, the distance separating both fourth electrically conductive vias (V4) can be 0.5 times the pitch of the set of second electrically conductive lines (Mintl).

In at least some embodiments, the width of each of the fourth electrically conductive vias (V4) measured along the first direction can be from 5 nm to 13 nm. As another example, the width of each of the fourth electrically conductive vias (V4) measured along the first direction can be from 6 nm to 11 nm. As yet another example, the width of each of the fourth electrically conductive vias (V4) measured along the first direction can be from 7 nm to 11 nm. As still yet another example, the width of each of the fourth electrically conductive vias (V4) measured along the first direction can be from 8 nm to 10 nm. And as yet another example, the width of each of the fourth electrically conductive vias (V4) measured along the first direction can be 9 nm.

In at least some embodiments, the distance separating both fourth electrically conductive vias (V4) can be from 5 nm to 13 nm. As another example, the distance separating both fourth electrically conductive vias (V4) can be from 6 nm to 11 nm. As yet another example, the distance separating both fourth electrically conductive vias (V4) can be from 7 nm to 11 nm. As still yet another example, the distance separating both fourth electrically conductive vias (V4) can be preferably from 8 nm to 10 nm. And as yet another example, the distance separating both fourth electrically conductive vias (V4) can be 9 nm.

In at least some embodiments, the first interruption (30) and the second interruption (31) can each have a width of from 5 nm to 13 nm. As another example, the first interruption (30) and the second interruption (31) can each have a width of from 6 nm to 11 nm. As yet another example, the first interruption (30) and the second interruption (31) can each have a width of from 7 nm to 11 nm. As still yet another example, the first interruption (30) and the second interruption (31) can each have a width of from 8 nm to 10 nm. And, as still yet another example, the first interruption (30) and the second interruption (31) can each have a width of 9 nm. Such a small interruption, let alone with perfect alignment to the gap, has up to now been very challenging. It can, however, be achieved with an example method of the present disclosure.

In at least some embodiments, a second aspect of the present disclosure relates to an integrated circuit or an intermediate (15) in the fabrication thereof obtainable by any embodiment of the first aspect.

In at least some embodiments of the second aspect, the present disclosure relates to an integrated circuit or an intermediate (15) in the fabrication of an integrated circuit comprising a semiconductor structure (16). The semiconductor structure (16) can comprise two transistor structures (3a, 3b) separated by a dielectric separation (7). Each transistor structure (3a, 3b) comprises a pMOS side (5p) of a first doping type and an nMOS side (5n) of a second doping type. Each side forms a channel structure, a source portion, and a drain portion. The source portion and the drain portion being horizontally separated by the channel structure. The semiconductor structure (16) also comprises a gate structure on the channel structure. The gate structure comprises a gate electrode (1). The semiconductor structure (16) also comprises electrically conductive contacts (M0A) electrically coupled to the source portion and the drain portion of each side (5p, 5n) of each transistor structure (3a, 3b). The semiconductor structure (16) also comprises a first dielectric layer (8) over the two transistor structures (3a, 3b), the gate structure, and the electrically conductive contacts (M0A). The semiconductor structure (16) also comprises a first electrically conductive line (M0B) embedded in the first dielectric layer (8), the first electrically conductive line (M0B) being arranged within a first metallization level and extending along a first direction. The semiconductor structure (16) also comprises a first electrically conductive via (V0A1) electrically connecting the first electrically conductive line (M0B) with a first electrically conductive contact (M0A1) on a first side (5n, 5p) of a first transistor structure (3a) of the transistor structures (3a, 3b). The semiconductor structure (16) also comprises a second electrically conductive via (V0A2) electrically connecting the first electrically conductive line (M0B) with a second electrically conductive contact (M0A2) on a first side (5n, 5p) of a second transistor structure (3b) of the transistor structures (3a, 3b). The semiconductor structure (16) also comprises spacers (13) along sidewalls of the first electrically conductive line (M0B). The semiconductor structure (16) also comprises a third electrically conductive via (VintG) through the second (10) and first dielectric layer (8) and touching a spacer (13) and the gate electrode (1).

In at least some embodiments, the first electrically conductive line (M0B) extends above at least part of each transistor structure (3a, 3b) and the spacers (13) are along each sidewall of the first electrically conductive line (M0B). This is the case in at least in FIG. 12 to FIG. 17. In other embodiments, such as the embodiments related to FIG. 18 to FIG. 20, the first electrically conductive line (M0B) comprises two parts separated by a first interruption (30) within the first electrically conductive line (M0B), a first part extending above at least part of a first transistor structure (3a) and a second part extending above at least part of a second transistor structure (3b), thereby electrically separating the first electrically conductive via (V0A1) from the second electrically conductive via (V0A2), and the spacers are along each sidewall of each part of the first electrically conductive line (M0B) except along the sidewalls facing the interruption (30).

In at least some other embodiments, the first electrically conductive line (M0B) can comprise a gap cutting the first electrically conductive line (M0B) in two, thereby electrically separating the first electrically conductive via (V0A1) from the second electrically conductive via (V0A2).

Any feature of the second aspect can be as correspondingly described in any embodiments of the first aspect.

Although preferred embodiments, specific constructions and configurations, as well as materials, have been discussed herein for devices according to the present disclosure, various changes or modifications in form and detail can be made without departing from the scope of this disclosure. For example, any formulas given above are merely representative of procedures that can be used. Functionality may be added or deleted from the block diagrams and operations can be interchanged among functional blocks. Additional function(s) can be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming an integrated circuit or an intermediate in a formation thereof, the method comprising:
provide a semiconductor structure comprising:
two transistor structures separated by a dielectric separation, each transistor structure comprising a pMOS side of a first doping type and an nMOS side of a second doping type, each side forming a channel structure, a source portion, and a drain portion, the source portion and the drain portion being horizontally separated by the channel structure,
a gate structure on the channel structure, the gate structure comprising a gate electrode and a gate plug,
electrically conductive contacts electrically coupled to the source portion and the drain portion of each side of each transistor structure,
a first dielectric layer over the two transistor structures, the gate structure, and the electrically conductive contacts,
a first electrically conductive line embedded in the first dielectric layer so that a top surface of the first electrically conductive line and a top surface of the first dielectric layer are coplanar, the first electrically conductive line being arranged within a first metallization level and extending along a first direction, the first electrically conductive line extending above at least part of each transistor structure,
a first electrically conductive via electrically connecting the first electrically conductive line with a first electrically conductive contact on a first side of a first of the transistor structures,
a second electrically conductive via electrically connecting the first electrically conductive line with a second electrically conductive contact on a first side of a second of the transistor structures;
recessing the first dielectric layer so as to expose a top portion of all sidewalls of the first electrically conductive line;
providing spacers along each sidewall of the first electrically conductive line;
depositing a second dielectric layer on the first dielectric layer so that a top surface of the spacers, a top surface of the first electrically conductive line, and a top surface of the second dielectric layer are coplanar;
etching through the second dielectric layer, the first dielectric layer, and the gate plug by using at least one of the spacers as a mask, thereby forming an opening exposing a top surface of the gate electrode; and
providing an electrically conductive material in the opening, thereby forming a third electrically conductive via.

2. The method according to claim 1, wherein:
the two transistor structures are two nanosheet transistor structures,
the pMOS side of the first doping type and the nMOS side of the second doping type are separated by a dielectric wall,
each side comprises a plurality of vertically stacked nanosheets that form the channel structure, the source portion, and the drain portion,
the source portion and the drain portion are horizontally separated by the channel structure, and
each nanosheet has one side touching the dielectric wall.

3. The method of claim 1, further comprising:
providing a first hard mask over the first dielectric layer, the first hard mask having an opening with its length extending along a first direction, the opening extending above at least part of each transistor structure;
etching partly through the first dielectric layer by using the first hard mask as an additional mask, thereby forming a trench with a bottom formed by the first dielectric layer;
covering a central portion of the bottom with a second hard mask, and etching two holes, one on each side of the second hard mask, by using the first and second hard masks as masks, thereby exposing a first electrically conductive contact and a second electrically conductive contact;
removing the first hard mask and second hard mask; and
filling both holes and the trench with an electrically conductive material, thereby forming a first electrically conductive line, the first electrically conductive via, and the second electrically conductive via.

4. The method of claim 1, further comprising:
providing a protection selectively on the top surface of the first electrically conductive line,
wherein depositing the second dielectric layer on the first dielectric layer results in a top surface of the protection, rather than the top surface of the first electrically conductive line, being coplanar with the top surface of the spacers and the top surface of the second dielectric layer.

5. The method of claim 4, wherein the protection is a dielectric protection.

6. The method of claim 5, wherein the dielectric protection is $TiO_2$.

7. The method of claim 4, further comprising:
partially recessing the first electrically conductive line, thereby forming a recess, and
providing the protection in the recess in such a way that a top surface of the protection is coplanar with a top surface of the first dielectric layer.

8. The method of claim 4, further comprising:
providing a third dielectric layer on the second dielectric layer, the top surface of the spacers, a top surface of the third electrically conductive via, and the top surface of the protection,
providing a hard mask on a top surface of the third dielectric layer, the hard mask having two openings, a separation between both openings being smaller than a space between the first electrically conductive via and the second electrically conductive via, the separation being directly above the space between the first electrically conductive via and the second electrically conductive via, one of the openings laterally overlapping with the third electrically conductive via;
etching through the third dielectric layer and through the protection by using the hard mask as an additional mask, thereby forming two longitudinal openings, extending along a second direction, perpendicular to the first direction, each of the longitudinal openings exposing the first electrically conductive line and the third electrically conductive via by respective first and second via holes communicating with the longitudinal openings;
providing an electrically conductive material in the two longitudinal openings, thereby forming:

two second electrically conductive lines arranged within a second metallization level, and extending along the second direction, separated by the separation, and two fourth electrically conductive vias, one of them being directly physically connected to one of the two second electrically conductive lines and to the first electrically conductive line, the other one being directly physically connected to the other of the two second electrically conductive lines and to the first electrically conductive line, and two fifth electrically conductive vias, one of them being directly physically connected to one of the two second electrically conductive lines and to the third electrically conductive via, the other one being directly physically connected to the other of the two second electrically conductive lines and to the third electrically conductive via;

etching between both fourth electrically conductive vias, through an entire thickness of the first electrically conductive line, by using both fourth electrically conductive vias as masks, thereby cutting the first electrically conductive line, thereby forming a first interruption within the first electrically conductive line; and etching between both fifth electrically conductive vias, through an entire thickness of the third electrically conductive via, by using both fifth electrically conductive vias as masks, thereby cutting the third electrically conductive via, thereby forming a second interruption within the third electrically conductive via.

9. The method of claim 8, further comprising:
after etching between both fifth electrically conductive vias, filling the first interruption and the second interruption with a dielectric material.

10. The method of claim 9, further comprising:
after etching between both fifth electrically conductive vias or after filling the first interruption and the second interruption with the dielectric material:
forming, above the second metallization level, a set of third electrically conductive lines arranged within a third metallization level, and extending along the first direction, and
forming a via electrically connecting a third electrically conductive line with a second electrically conductive line.

11. The method of claim 10, wherein the integrated circuit is formed with a standard cell.

12. The method of claim 11, wherein the standard cell comprises:
four second electrically conductive lines; and
more than four third electrically conductive lines.

13. The method of claim 1, further comprising:
providing a third dielectric layer on the second dielectric layer, the top surface of the spacers, a top surface of the third electrically conductive via, and the top surface of the first electrically conductive line,
providing a hard mask on a top surface of the third dielectric layer, the hard mask having two openings, a separation between both openings being smaller than a space between the first electrically conductive via and the second electrically conductive via, the separation being directly above a space between the first electrically conductive via and the second electrically conductive via, one of the openings laterally overlapping with the third electrically conductive via;
etching through the third dielectric layer by using the hard mask as an additional mask, thereby forming two longitudinal openings, extending along a second direction, perpendicular to the first direction, each of the longitudinal openings exposing the first electrically conductive line and the third electrically conductive via by respective first and second via holes communicating with the longitudinal openings;

providing an electrically conductive material in the two longitudinal openings, thereby forming:
two second electrically conductive lines arranged within a second metallization level, and extending along the second direction, separated by the separation, and two fourth electrically conductive vias, one of them being directly physically connected to one of the two second electrically conductive lines and to the first electrically conductive line, the other one being directly physically connected to the other of the two second electrically conductive lines and to the first electrically conductive line, and two fifth electrically conductive vias, one of them being directly physically connected to one of the two second electrically conductive lines and to the third electrically conductive via, the other one being directly physically connected to the other of the two second electrically conductive lines and to the third electrically conductive via;

etching between both fourth electrically conductive vias, through an entire thickness of the first electrically conductive line, by using both fourth electrically conductive vias as masks, thereby cutting the first electrically conductive line, thereby forming a first interruption within the first electrically conductive line; and etching between both fifth electrically conductive vias, through an entire thickness of the third electrically conductive via, by using both fifth electrically conductive vias as masks, thereby cutting the third electrically conductive via, thereby forming a second interruption within the third electrically conductive via.

14. The method of claim 13, further comprising:
after etching between both fifth electrically conductive vias, filling the first interruption and the second interruption with a dielectric material.

15. The method of claim 14, further comprising:
after etching between both fifth electrically conductive vias or after filling the first interruption and the second interruption with the dielectric material:
forming, above the second metallization level, a set of third electrically conductive lines arranged within a third metallization level, and extending along the first direction, and
forming a via electrically connecting a third electrically conductive line with a second electrically conductive line.

16. The method of claim 15, wherein the integrated cell is formed with a standard cell.

17. The method of claim 16, wherein:
the standard cell comprises four second electrically conductive lines; and
more than four third electrically conductive lines.

18. The method of claim 1, wherein the spacers are made of silicon nitride, silicon carbon nitride, silicon carbon oxynitride, or silicon oxycarbide, and/or have a thickness between 3 nm and 9 nm, inclusive.

19. An integrated circuit or an intermediate in a fabrication of an integrated circuit comprising:
a semiconductor structure comprising:

two transistor structures separated by a dielectric separation, each transistor structure comprising a pMOS side of a first doping type and an nMOS side of a second doping type, each side forming a channel structure, a source portion, and a drain portion, the source portion and the drain portion being horizontally separated by the channel structure;

a gate structure on the channel structure, the gate structure comprising a gate electrode;

electrically conductive contacts electrically coupled to the source portion and the drain portion of each side of each transistor structure;

a first dielectric layer over the two transistor structures, the gate structure, and the electrically conductive contacts;

a first electrically conductive line embedded in the first dielectric layer, the first electrically conductive line being arranged within a first metallization level and extending along a first direction;

a first electrically conductive via electrically connecting the first electrically conductive line with a first electrically conductive contact on a first side of a first of the transistor structures;

a second electrically conductive via electrically connecting the first electrically conductive line with a second electrically conductive contact on a first side of a second of the transistor structures;

spacers along sidewalls of the first electrically conductive line; and a third electrically conductive via through the first dielectric layer and touching one of the spacers and the gate electrode.

20. The integrated circuit or the intermediate in the fabrication of the integrated circuit of claim 19, wherein either:

the first electrically conductive line extends above at least part of each transistor structure and the spacers are along each sidewall of the first electrically conductive line, or the first electrically conductive line comprises two parts separated by a first interruption within the first electrically conductive line, a first part extending above at least part of a first transistor structure and a second part extending above at least part of a second transistor structure, thereby electrically separating the first electrically conductive via from the second electrically conductive via, and the spacers are along each sidewall of each part of the first electrically conductive line except along the sidewalls facing the first interruption.

* * * * *